US010789878B2

(12) United States Patent
Chibashi et al.

(10) Patent No.: US 10,789,878 B2
(45) Date of Patent: Sep. 29, 2020

(54) LIGHT SOURCE DEVICE, LIGHT-EMITTING DEVICE, AND DISPLAY DEVICE

(71) Applicant: Sony Corporation, Tokyo (JP)

(72) Inventors: Masaru Chibashi, Kanagawa (JP); Ken Kikuchi, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/471,877

(22) PCT Filed: Nov. 8, 2017

(86) PCT No.: PCT/JP2017/040229
§ 371 (c)(1),
(2) Date: Jun. 20, 2019

(87) PCT Pub. No.: WO2018/123280
PCT Pub. Date: Jul. 5, 2018

(65) Prior Publication Data
US 2020/0126473 A1    Apr. 23, 2020

(30) Foreign Application Priority Data

Dec. 27, 2016    (JP) .................................. 2016-253603

(51) Int. Cl.
*G06F 3/038*    (2013.01)
*G09G 3/32*    (2016.01)
*G09G 3/34*    (2006.01)

(52) U.S. Cl.
CPC .............. *G09G 3/32* (2013.01); *G09G 3/3426* (2013.01); *G09G 2300/0452* (2013.01); *G09G 2310/0272* (2013.01); *G09G 2310/0294* (2013.01)

(58) Field of Classification Search
CPC ... G09G 2300/0452; G09G 2310/0272; G09G 2310/0294; G09G 3/14; G09G 3/20;
(Continued)

(56) References Cited

U.S. PATENT DOCUMENTS

2006/0232219 A1   10/2006   Xu
2008/0303452 A1   12/2008   Van Erp
(Continued)

FOREIGN PATENT DOCUMENTS

JP    62-275293 A    11/1987
JP    07-152337 A    6/1995
(Continued)

OTHER PUBLICATIONS

International Search Report and English translation thereof dated Dec. 19, 2017 in connection with International Application No. PCT/JP2017/040229.

*Primary Examiner* — Insa Sadio
(74) *Attorney, Agent, or Firm* — Wolf, Greenfield & Sacks, P.C.

(57) ABSTRACT

A light source device according to the present disclosure includes: a first terminal, a second terminal, a third terminal, and a fourth terminal; a first light-emitting element that is disposed in a first path from the first terminal to the second terminal, includes a first electrode of a first type and a second electrode of a second type coupled to the second terminal, and emits first basic color light; a second light-emitting element that is disposed in a second path from the second terminal to the third terminal, includes a first electrode of the first type coupled to the second terminal and a second electrode of the second type, and emits second basic color light; and a third light-emitting element that is disposed in a third path from the second terminal to the fourth terminal, includes a first electrode of the first type coupled to the second terminal and a second electrode of the second type, and emits third basic color light.

16 Claims, 18 Drawing Sheets

(58) Field of Classification Search
CPC ...... G09G 3/32; G09G 3/3233; G09G 3/3426; H01L 33/00; H05B 47/10
See application file for complete search history.

(56) References Cited

U.S. PATENT DOCUMENTS

| | | | |
|---|---|---|---|
| 2011/0134021 A1* | 6/2011 | Schmitz | ............... H05B 45/20 345/83 |
| 2011/0304274 A1 | 12/2011 | Van Erp | |
| 2012/0306942 A1* | 12/2012 | Fujiwara | ............. G09G 3/3413 345/690 |
| 2014/0125237 A1 | 5/2014 | Van Erp | |

FOREIGN PATENT DOCUMENTS

| | | |
|---|---|---|
| JP | 2005-302712 A | 10/2005 |
| JP | 2006-525664 A | 11/2006 |
| JP | 2009-519580 A | 5/2009 |
| JP | 2016-212239 A | 12/2016 |
| WO | WO 2004/100612 A1 | 11/2004 |
| WO | WO 2007/069200 A1 | 6/2007 |
| WO | WO 2016/196390 A1 | 12/2016 |

* cited by examiner

[ FIG. 1 ]
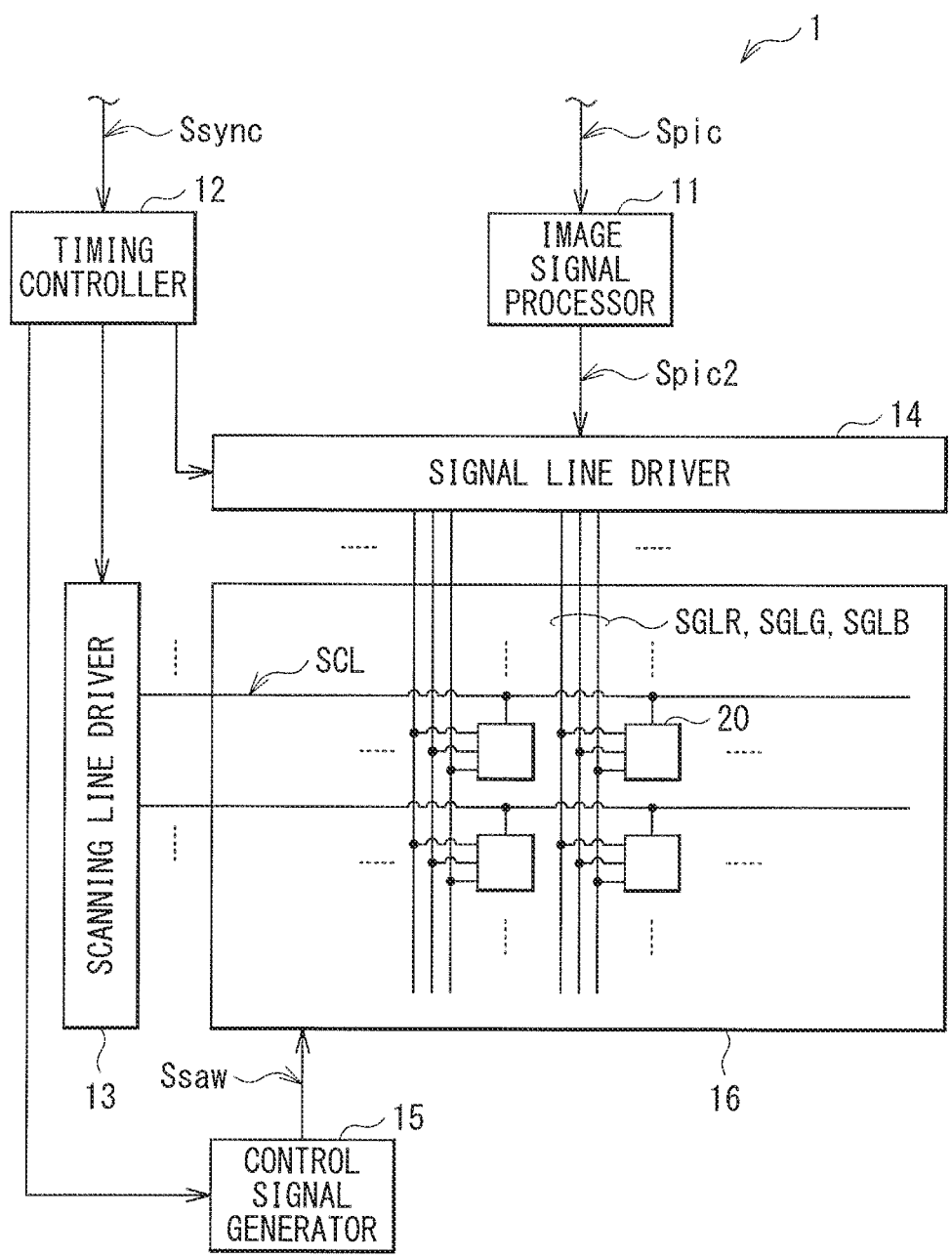

[FIG. 2]
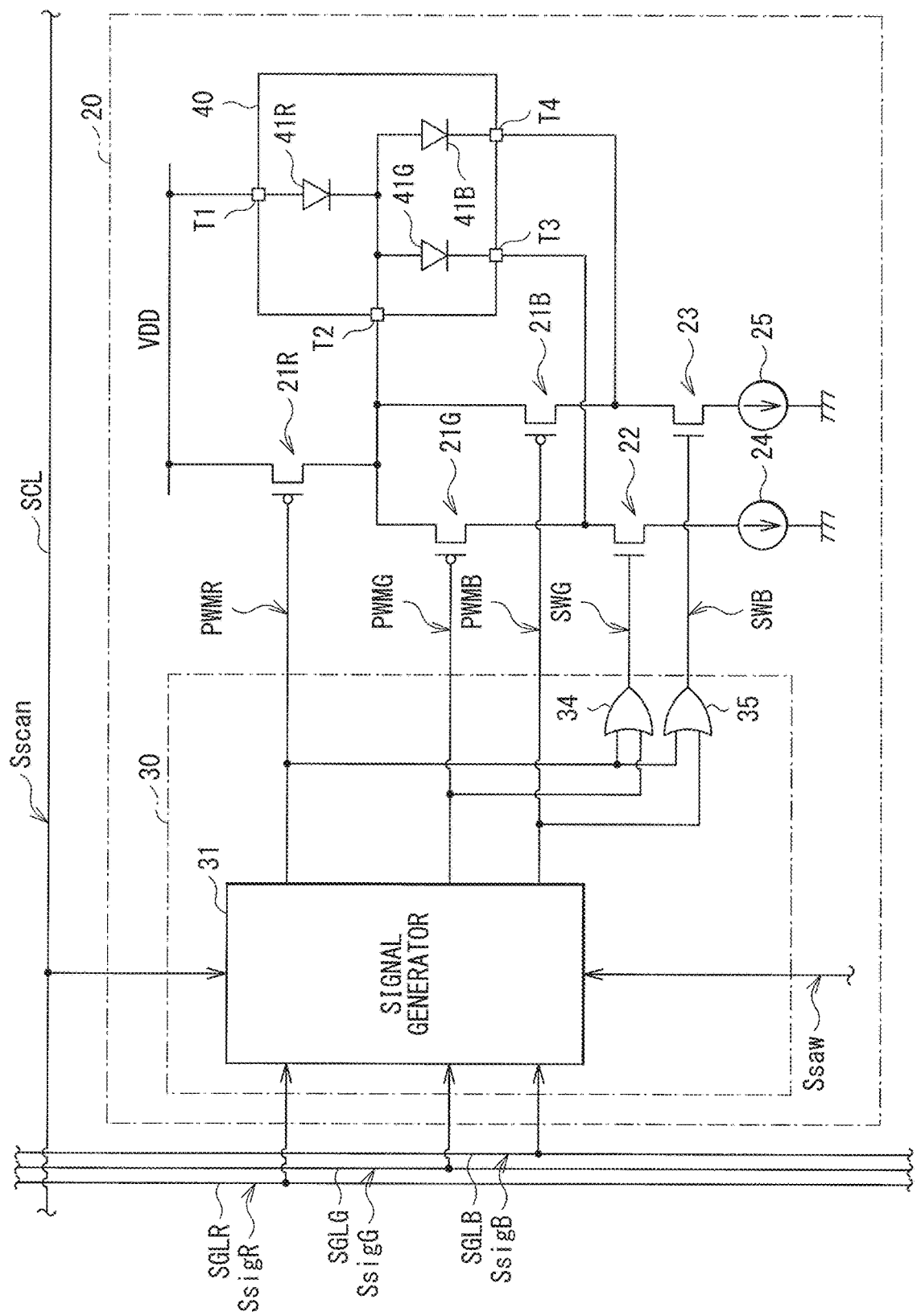

[ FIG. 3 ]
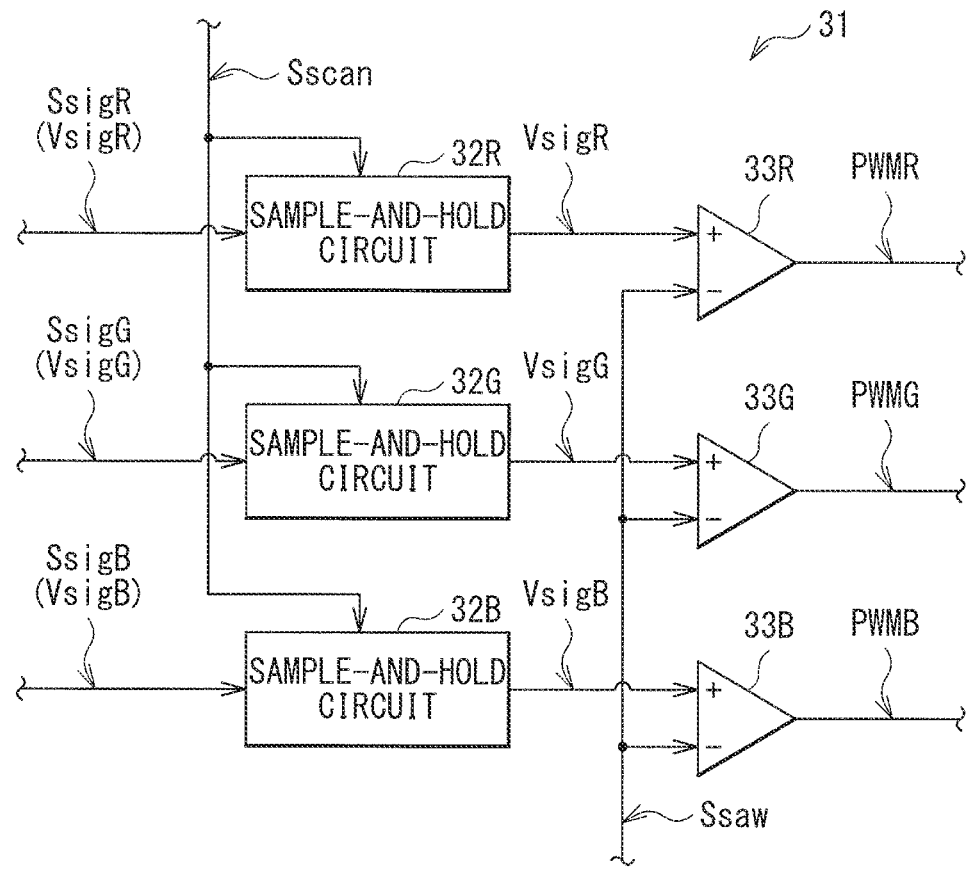
[ FIG. 4 ]
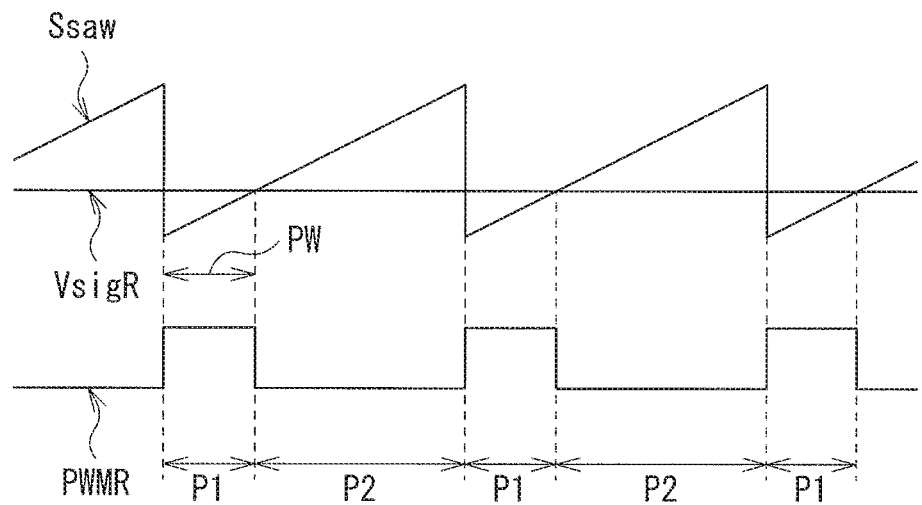

[FIG. 5]

| SIGNAL PWMR | SIGNAL PWMG | SIGNAL PWMB | SIGNAL SWG | SIGNAL SWB | TRANSISTOR 21R | TRANSISTOR 21G | TRANSISTOR 21B | TRANSISTOR 22 | TRANSISTOR 23 | LIGHT-EMITTING ELEMENT 41R | LIGHT-EMITTING ELEMENT 41G | LIGHT-EMITTING ELEMENT 41B |
|---|---|---|---|---|---|---|---|---|---|---|---|---|
| H | H | H | H | H | OFF | OFF | OFF | ON | ON | LIGHT EMISSION | LIGHT EMISSION | LIGHT EMISSION |
| H | H | L | H | H | OFF | OFF | ON | ON | ON | LIGHT EMISSION | LIGHT EMISSION | NON-LIGHT EMISSION |
| H | L | H | H | H | OFF | ON | OFF | ON | ON | LIGHT EMISSION | NON-LIGHT EMISSION | LIGHT EMISSION |
| H | L | L | H | H | OFF | ON | ON | ON | ON | LIGHT EMISSION | NON-LIGHT EMISSION | NON-LIGHT EMISSION |
| L | H | H | H | H | ON | OFF | OFF | ON | ON | NON-LIGHT EMISSION | LIGHT EMISSION | LIGHT EMISSION |
| L | H | L | H | L | ON | OFF | ON | OFF | OFF | NON-LIGHT EMISSION | LIGHT EMISSION | NON-LIGHT EMISSION |
| L | L | H | L | H | ON | ON | OFF | OFF | ON | NON-LIGHT EMISSION | NON-LIGHT EMISSION | LIGHT EMISSION |
| L | L | L | L | L | ON | ON | ON | OFF | OFF | NON-LIGHT EMISSION | NON-LIGHT EMISSION | NON-LIGHT EMISSION |

[ FIG. 6A ]
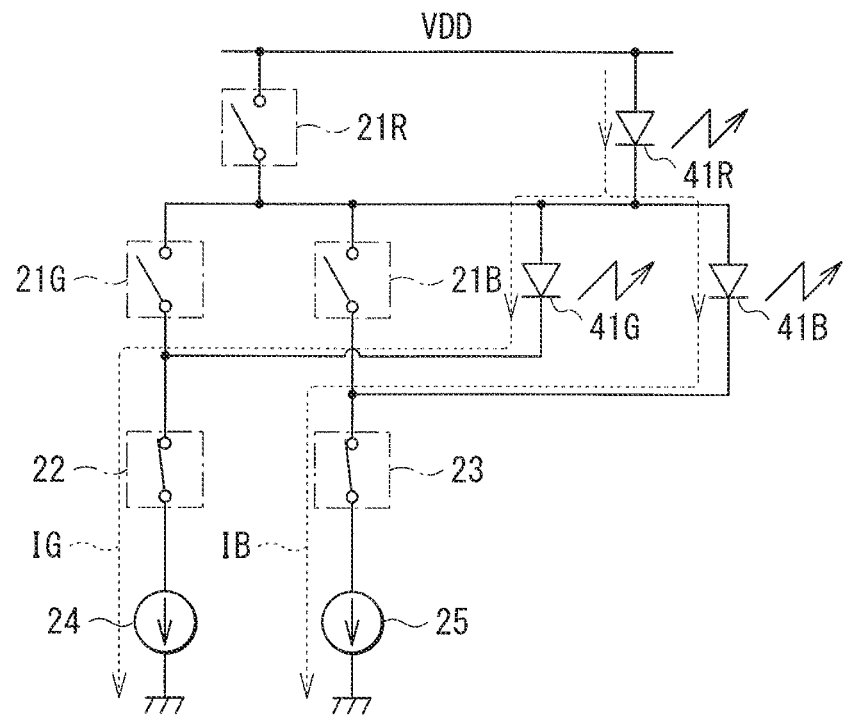
[ FIG. 6B ]
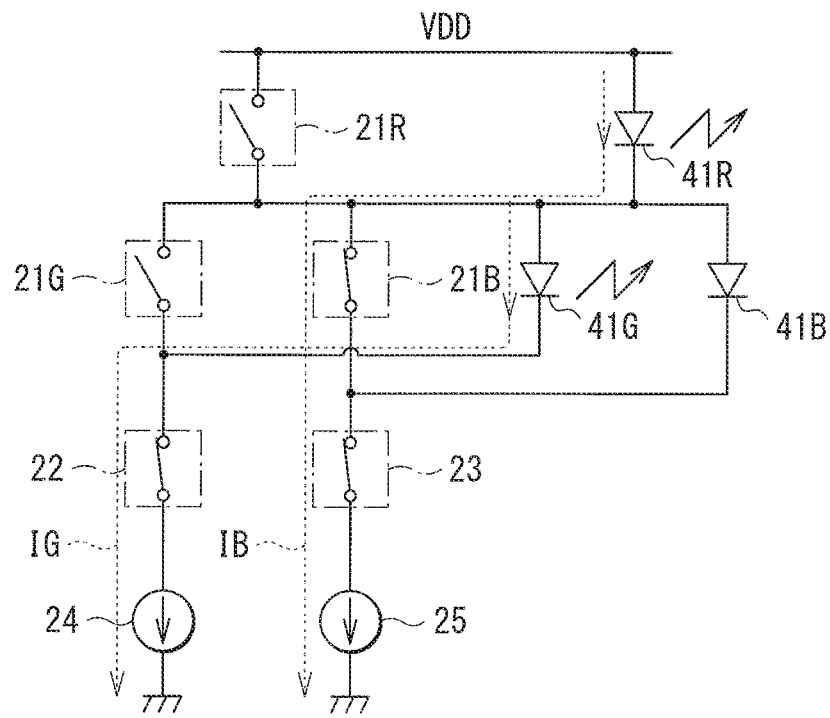

[ FIG. 6C ]
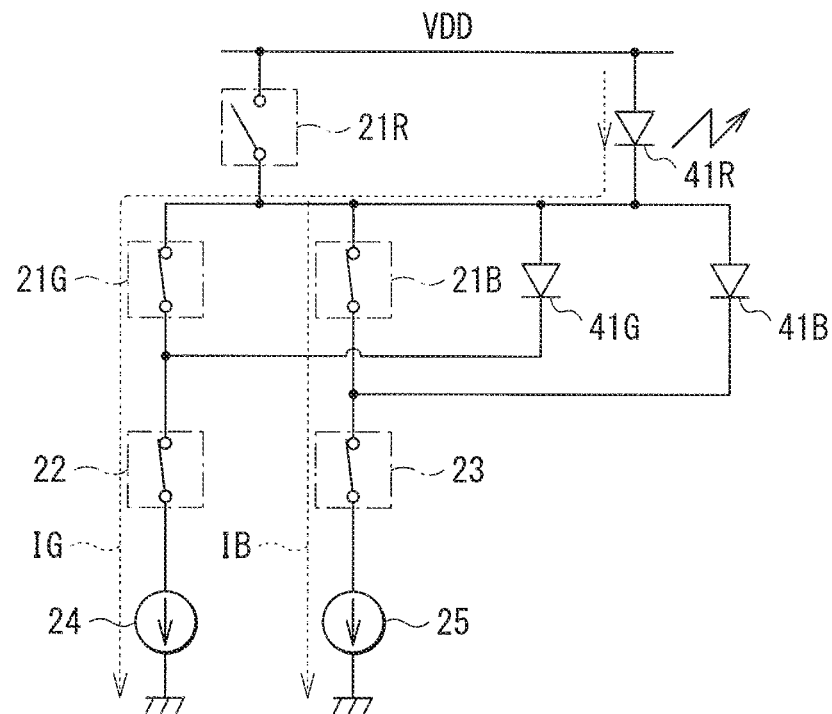
[ FIG. 6D ]
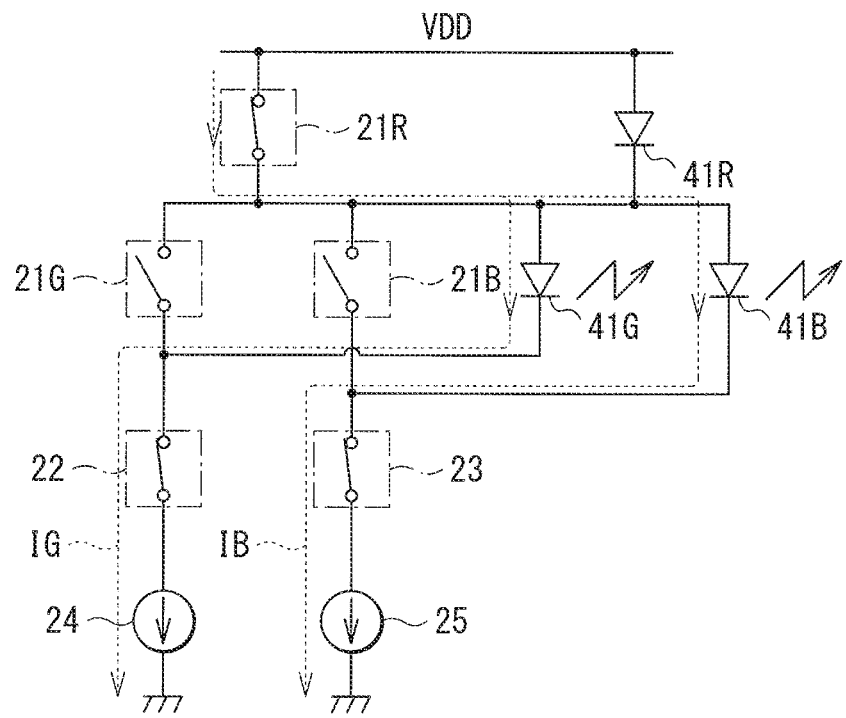

[ FIG. 6E ]
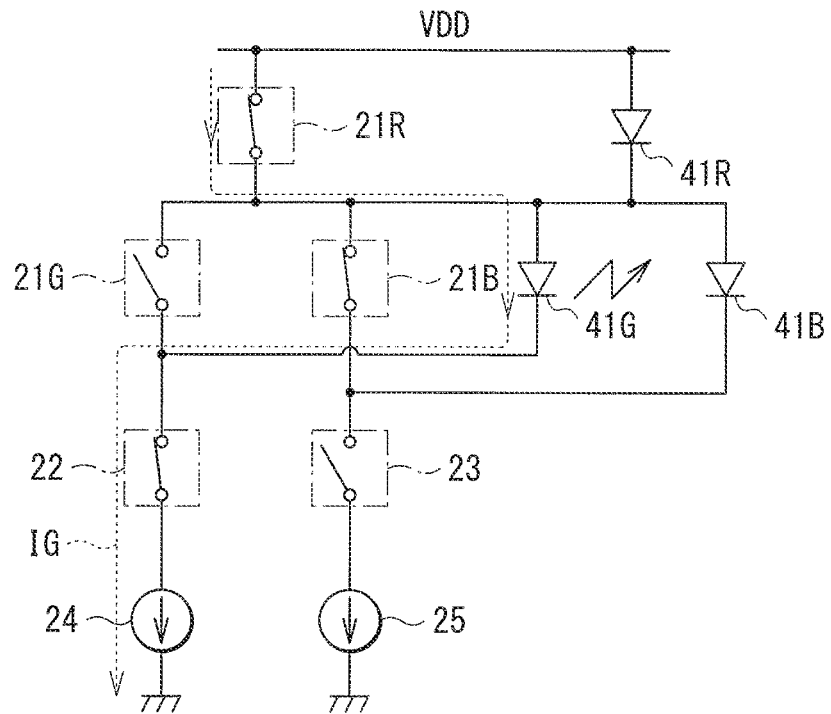
[ FIG. 6F ]
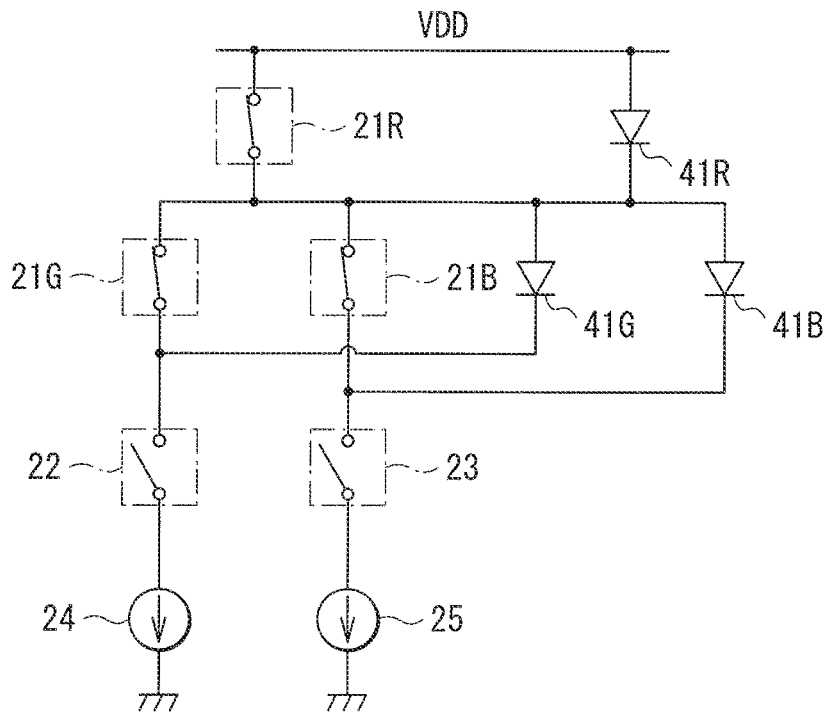

[FIG. 7]
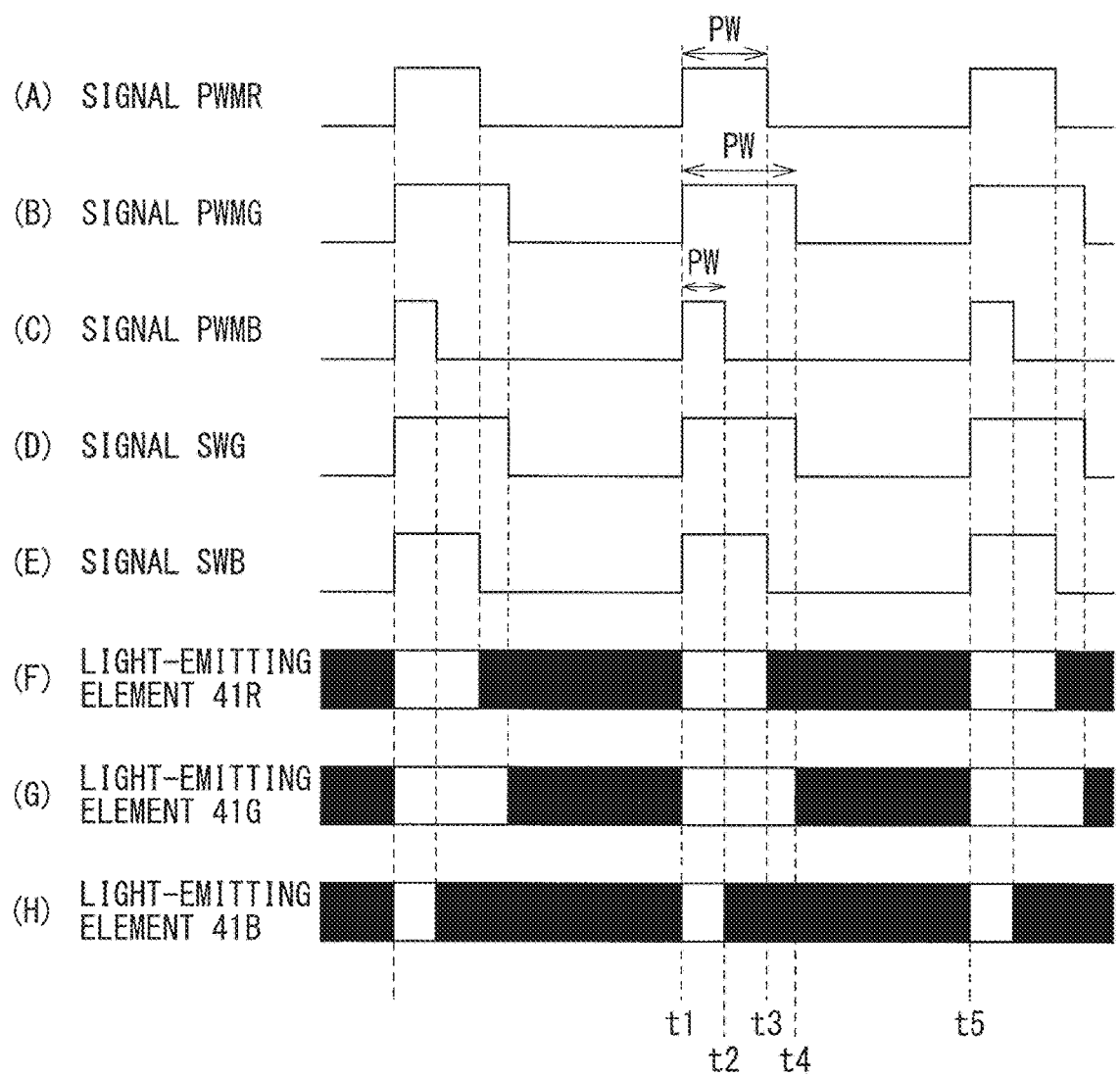

[FIG. 8]
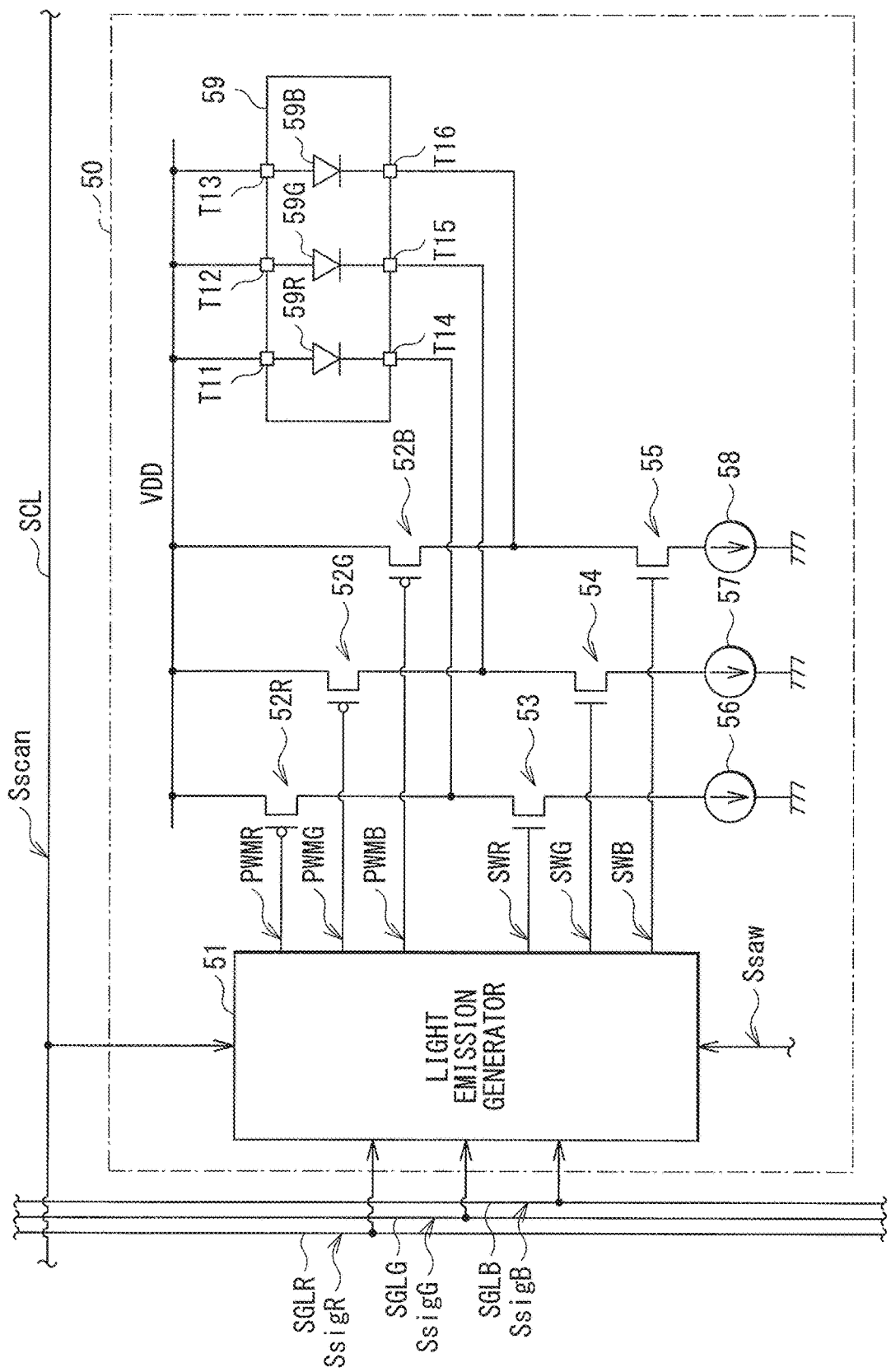

[FIG. 9]
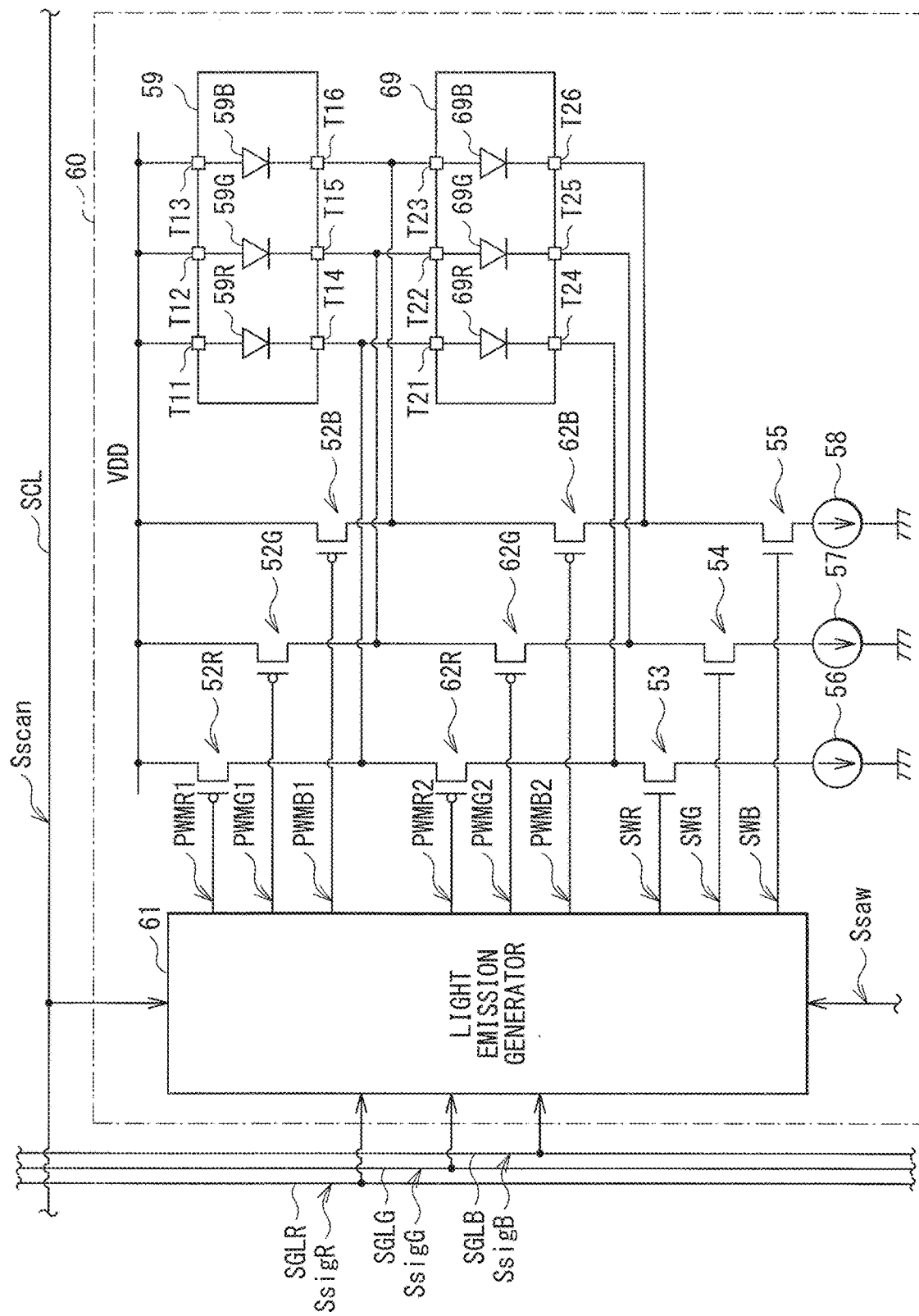

[ FIG. 10 ]
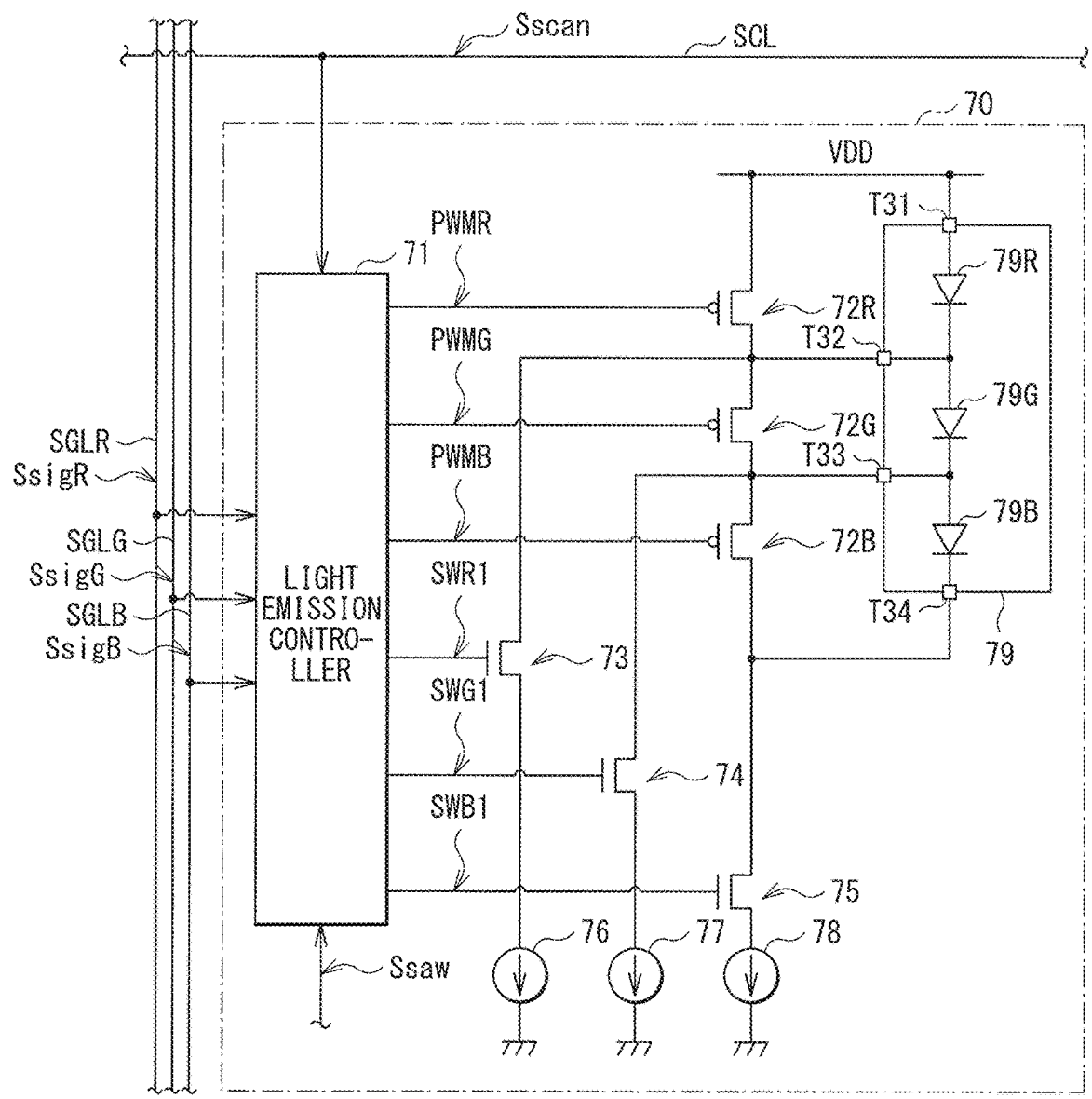

[ FIG. 11 ]
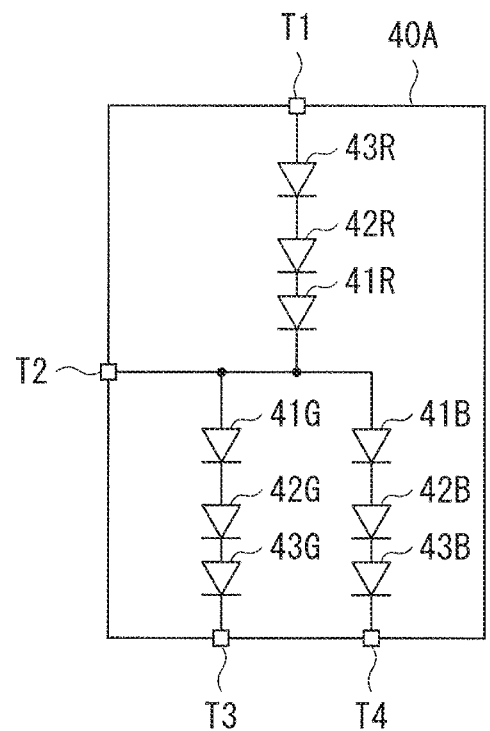
[ FIG. 12 ]
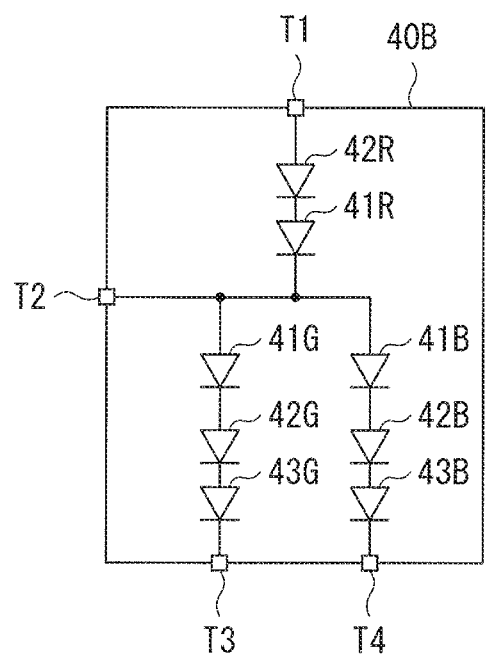

[ FIG. 13 ]
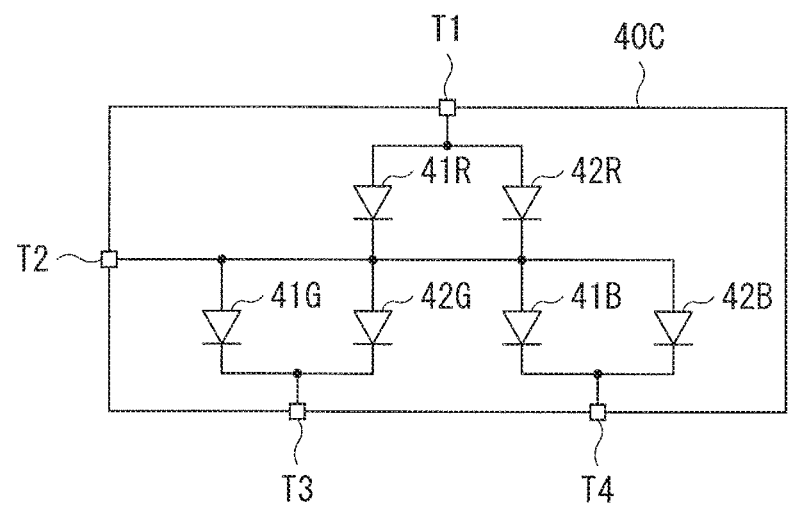
[ FIG. 14 ]
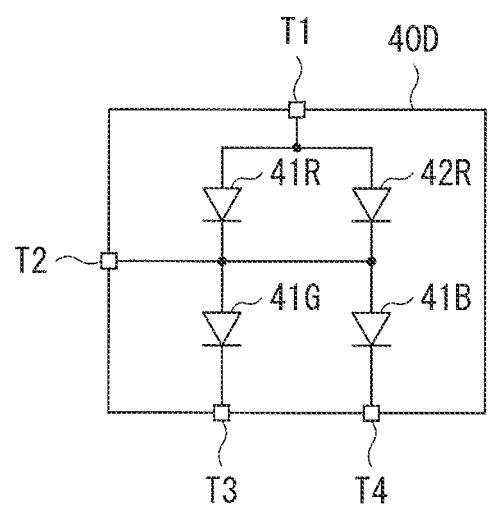

[ FIG. 15 ]
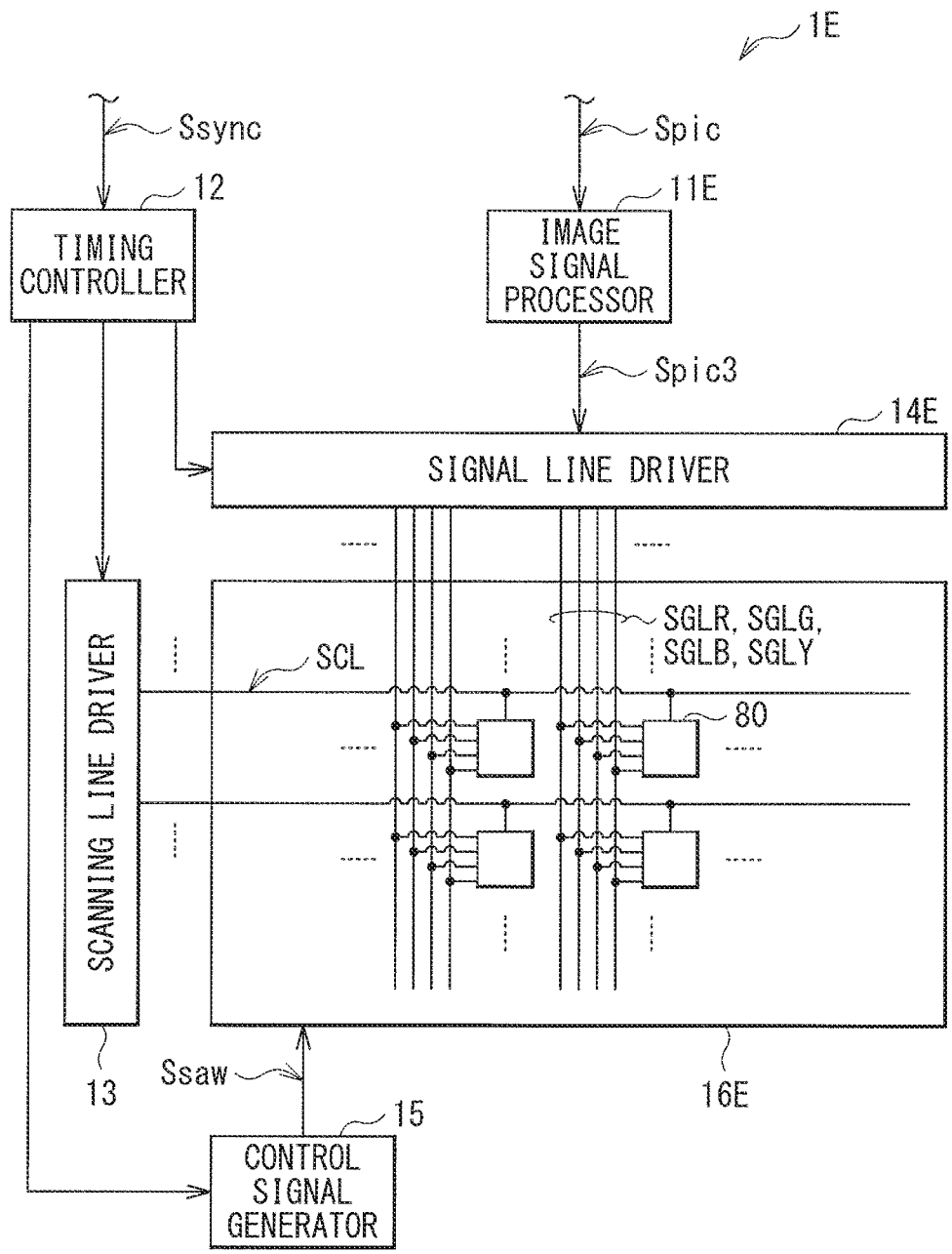

[FIG. 16]
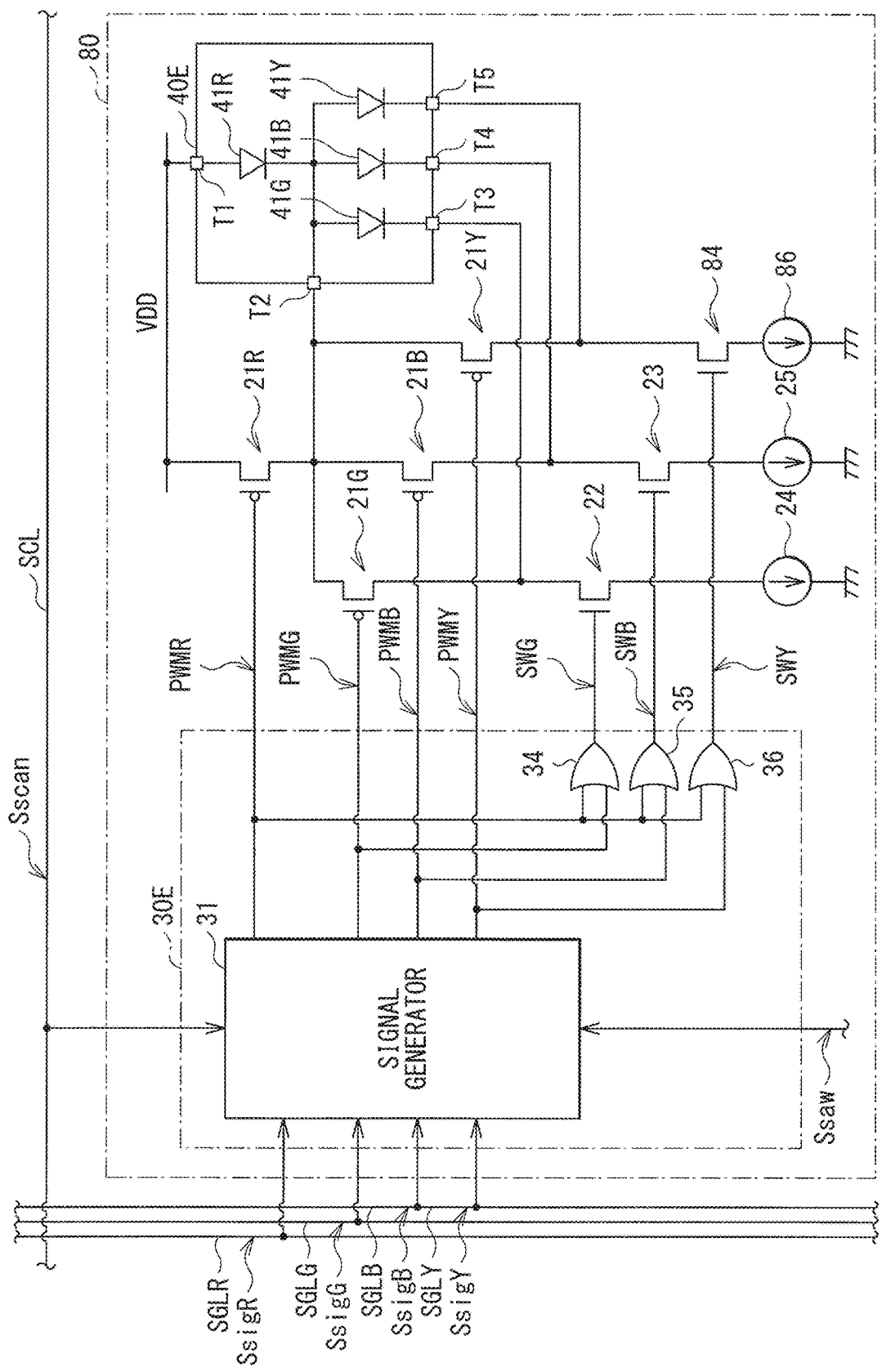

[ FIG. 17 ]
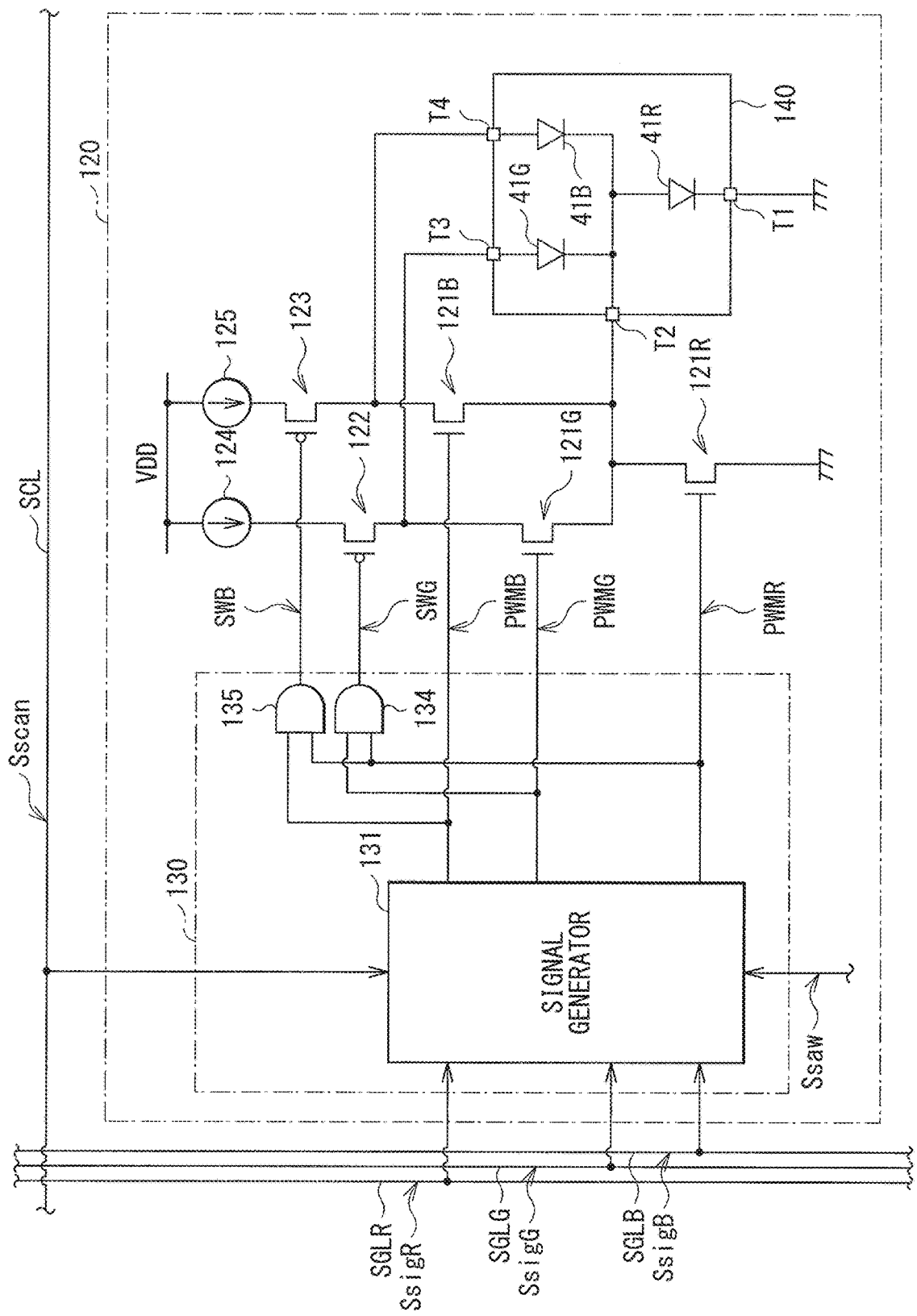

[ FIG. 18 ]
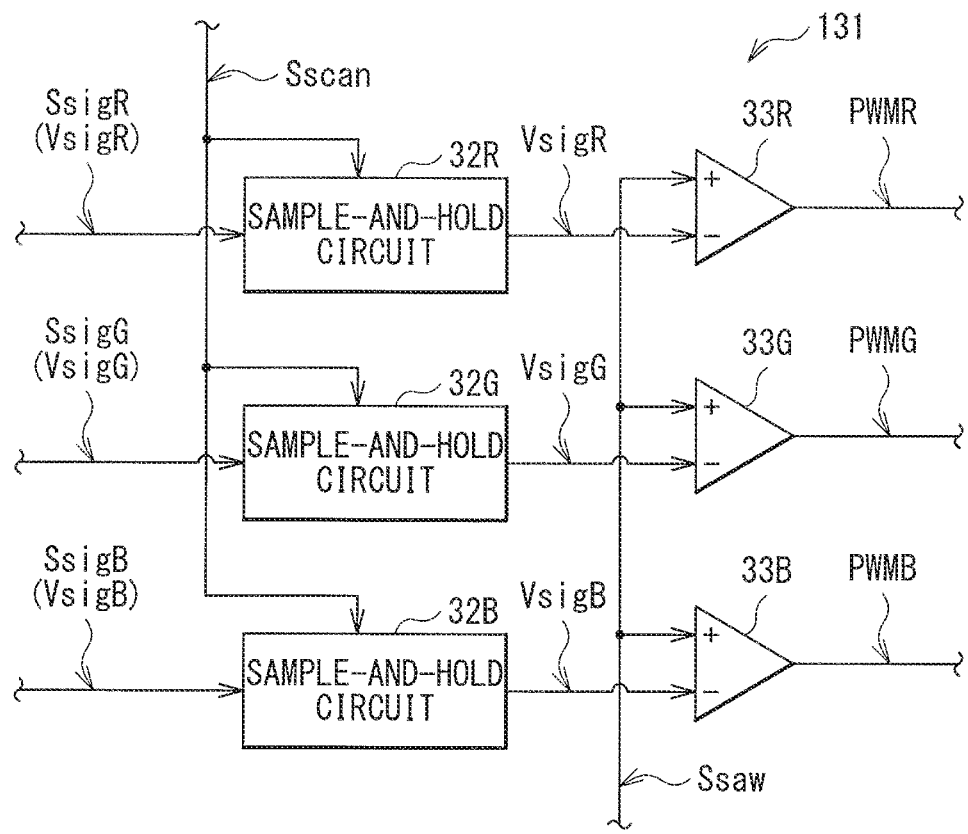
[ FIG. 19 ]
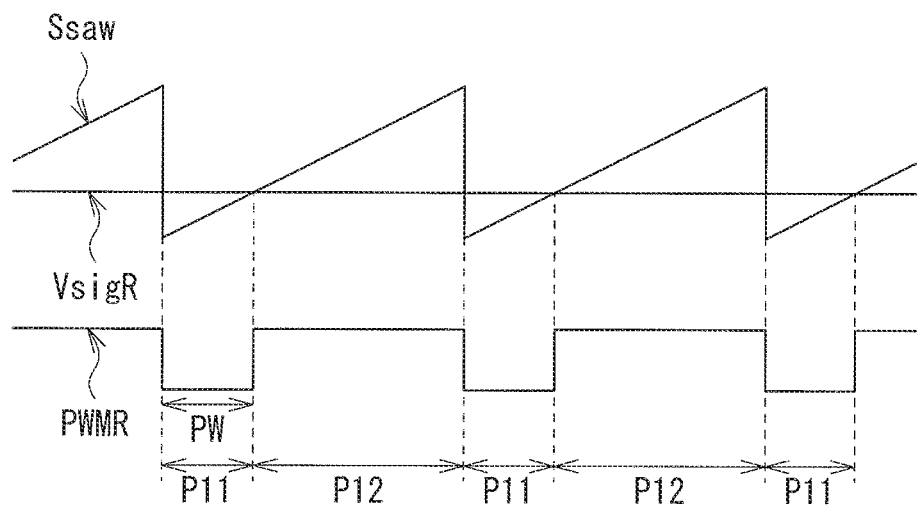

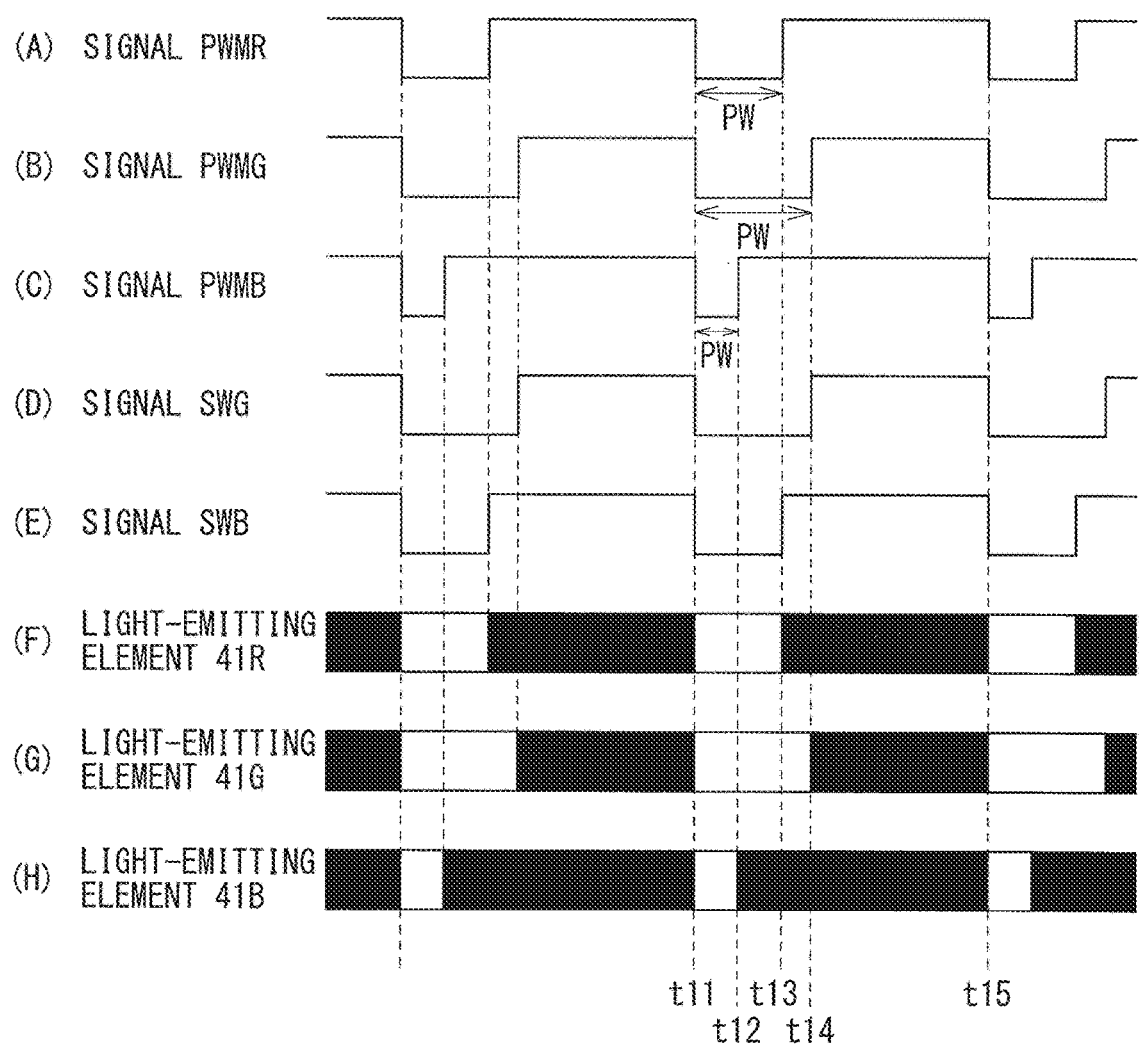
[FIG. 20]

LIGHT SOURCE DEVICE, LIGHT-EMITTING DEVICE, AND DISPLAY DEVICE

CROSS REFERENCE TO RELATED APPLICATIONS

This is a U.S. National Stage Application under 35 U.S.C. § 371, based on International Application No. PCT/JP2017/040229, filed Nov. 8, 2017, which claims priority to Japanese Patent Application JP 2016-253603, filed Dec. 27, 2016, each of which is hereby incorporated by reference in its entirety.

TECHNICAL FIELD

The present disclosure relates to a light source device that emits light of a plurality of colors, and a light-emitting device and a display device that have such a light source device.

BACKGROUND ART

In light-emitting devices, a light-emitting diode is frequently used as a light-emitting element. For example, PTL 1 discloses a light-emitting diode lighting circuit in which a plurality of light-emitting diodes is coupled in series to one another. Moreover, for example, PTL 2 discloses a display using a plurality of light-emitting diodes that is able to emit light of colors different from one another.

CITATION LIST

Patent Literature

PTL 1: Japanese Unexamined Patent Application Publication No. S62-275293
PTL 2: Japanese Unexamined Patent Application Publication No. H07-152337

SUMMARY OF THE INVENTION

Incidentally, electronic devices are generally desired to be compact, and light-emitting devices are also expected to be compact.

It is desirable to provide a light source device, a light-emitting device, and a display device that make it possible to achieve a compact configuration.

A light source device according to an embodiment of the present disclosure includes: a first terminal, a second terminal, a third terminal, and a fourth terminal; a first light-emitting element; a second light-emitting element, and a third light-emitting element. The first light-emitting element is disposed in a first path from the first terminal to the second terminal, includes a first electrode of a first type and a second electrode of a second type coupled to the second terminal, and emits first basic color light. The second light-emitting element is disposed in a second path from the second terminal to the third terminal, includes a first electrode of the first type coupled to the second terminal and a second electrode of the second type, and emits second basic color light. The third light-emitting element is disposed in a third path from the second terminal to the fourth terminal, includes a first electrode of the first type coupled to the second terminal and a second electrode of the second type, and emits third basic color light.

A light-emitting device according to an embodiment of the present disclosure includes: a first light-emitting element; a second light-emitting element; a third light-emitting element; a first switch; a second switch; a third switch; a first current source; a second current source; and a light emission controller. The first light-emitting element is disposed in a first path from a first terminal to a second terminal, includes a first electrode of a first type and a second electrode of a second type coupled to the second terminal, and emits first basic color light. The second light-emitting element is disposed in a second path from the second terminal to a third terminal, includes a first electrode of the first type coupled to the second terminal and a second electrode of the second type, and emits second basic color light. The third light-emitting element is disposed in a third path from the second terminal to a fourth terminal, includes a first electrode of the first type coupled to the second terminal and a second electrode of the second type, and emits third basic color light. The first switch is turned to an ON state to couple the first terminal and the second terminal to each other. The second switch is turned to the ON state to couple the second terminal and the third terminal to each other. The third switch is turned to the ON state to couple the second terminal and the fourth terminal to each other. The first current source is coupled to the third terminal. The second current source is coupled to the fourth terminal. The light emission controller controls operations of the first switch, the second switch, and the third switch.

A display device according to an embodiment of the present disclosure includes a plurality of light-emitting devices. Each of the light-emitting devices includes: a first light-emitting element; a second light-emitting element; a third light-emitting element; a first switch; a second switch; a third switch; a first current source; a second current source; and a light emission controller. The first light-emitting element is disposed in a first path from a first terminal to a second terminal, includes a first electrode of a first type and a second electrode of a second type coupled to the second terminal, and emits first basic color light. The second light-emitting element is disposed in a second path from the second terminal to a third terminal, includes a first electrode of the first type coupled to the second terminal and a second electrode of the second type, and emits second basic color light. The third light-emitting element is disposed in a third path from the second terminal to a fourth terminal, includes a first electrode of the first type coupled to the second terminal and a second electrode of the second type, and emits third basic color light. The first switch is turned to an ON state to couple the first terminal and the second terminal to each other. The second switch is turned to the ON state to couple the second terminal and the third terminal to each other. The third switch is turned to the ON state to couple the second terminal and the fourth terminal to each other. The first current source is coupled to the third terminal. The second current source is coupled to the fourth terminal. The light emission controller controls operations of the first switch, the second switch, and the third switch.

In the light source device, the light-emitting device, and the display device according to the embodiments of the present disclosure, the first light-emitting element that emits the first basic color light is disposed in the first path from the first terminal to the second terminal, the second light-emitting element that emits the second basic color light is disposed in the second path from the second terminal to the third terminal, and the third light-emitting element that emits the third basic color light is disposed in the third path from the second terminal to the fourth terminal. The second electrode of the first light-emitting element serves as an electrode of the second type, the first electrode of the second light-emitting element serves as an electrode of the first type, and the first electrode of the third light-emitting element serves as an electrode of the first type. The second electrode of the first light-emitting element, the first electrode of the second light-emitting element, and the first electrode of the third light-emitting element are coupled to the second terminal.

According to the light source device, the light-emitting device, and the display device according to the embodiments of the present disclosure, the second electrode of the first light-emitting element disposed in the first path, the first electrode of the second light-emitting element disposed in the second path, and the first electrode of the third light-emitting element disposed in the third path are coupled to the second terminal, which makes it possible to achieve a compact configuration. It is to be noted that effects described here are not necessarily limited and may include any of effects described in the present disclosure.

BRIEF DESCRIPTION OF THE DRAWINGS

FIG. 1 is a block diagram illustrating a configuration example of a display device according to an embodiment of the present disclosure.

FIG. 2 is a circuit diagram illustrating a configuration example of a pixel illustrated in FIG. 1.

FIG. 3 is a block diagram illustrating a configuration example of a signal generator illustrated in FIG. 2.

FIG. 4 is a timing waveform chart illustrating an operation example of the signal generator illustrated in FIG. 3.

FIG. 5 is a table illustrating an operation example of the pixel illustrated in FIG. 2.

FIG. 6A is an explanatory diagram illustrating an operation example of the pixel illustrated in FIG. 2.

FIG. 6B is an explanatory diagram illustrating another operation example of the pixel illustrated in FIG. 2.

FIG. 6C is an explanatory diagram illustrating another operation example of the pixel illustrated in FIG. 2.

FIG. 6D is an explanatory diagram illustrating another operation example of the pixel illustrated in FIG. 2.

FIG. 6E is an explanatory diagram illustrating another operation example of the pixel illustrated in FIG. 2.

FIG. 6F is an explanatory diagram illustrating another operation example of the pixel illustrated in FIG. 2.

FIG. 7 is a timing waveform chart illustrating an operation example of the pixel illustrated in FIG. 2.

FIG. 8 is a circuit diagram illustrating a configuration example of a pixel according to a comparative example.

FIG. 9 is a circuit diagram illustrating a configuration example of a pixel according to another comparative example.

FIG. 10 is a circuit diagram illustrating a configuration example of a pixel according to another comparative example.

FIG. 11 is a circuit diagram illustrating a configuration example of a light source section according to a modification example.

FIG. 12 is a circuit diagram illustrating a configuration example of a light source section according to another modification example.

FIG. 13 is a circuit diagram illustrating a configuration example of a light source section according to another modification example.

FIG. 14 is a circuit diagram illustrating a configuration example of a light source section according to another modification example.

FIG. 15 is a block diagram illustrating a configuration example of a display device according to another modification example.

FIG. 16 is a circuit diagram illustrating a configuration example of a pixel illustrated in FIG. 15.

FIG. 17 is a circuit diagram illustrating a configuration example of a pixel according to another modification example.

FIG. 18 is a block diagram illustrating a configuration example of a signal generator illustrated in FIG. 17.

FIG. 19 is a timing waveform chart illustrating an operation example of a signal generator illustrated in FIG. 18.

FIG. 20 is a timing waveform chart illustrating an operation example of the pixel illustrated in FIG. 17.

MODES FOR CARRYING OUT THE INVENTION

In the following, some embodiments of the present disclosure are described in detail with reference to the drawings.

EMBODIMENT

Configuration Example

FIG. 1 illustrates a configuration example of a display device (a display device 1) according to an embodiment. The display device 1 is a so-called self-luminous type display device using a light-emitting element as a display element. It is to be noted that a light source device and a light-emitting device according to an embodiment of the present disclosure are embodied by the present embodiment, and thus are described together. The display device 1 includes an image signal processor 11, a timing controller 12, a scanning line driver 13, a signal line driver 14, a control signal generator 15, and a display section 16.

The image signal processor 11 performs predetermined signal processing on an image signal Spic supplied from outside to generate an image signal Spic2. Examples of the predetermined signal processing include gamma correction, etc.

The timing controller 12 supplies a control signal to each of the scanning line driver 13, the signal line driver 14, and the control signal generator 15 on the basis of a synchronization signal S sync supplied from outside, and performs control to cause the scanning line driver 13, the signal line driver 14, and the control signal generator 15 to operate in synchronization with one another.

The scanning line driver 13 sequentially applies a scanning signal to a plurality of scanning lines SCL (to be described later) of the display section 16 in accordance with the control signal supplied from the timing controller 12 to sequentially select pixels 20 (to be described later) on a row-by-row basis.

The signal line driver 14 generates a plurality of signals SsigR including a pixel voltage VsigR, a plurality of signals SsigG including a pixel voltage VsigG, and a plurality of signals SsigB including a pixel voltage VsigB in accordance with the image signal Spic2 supplied from the image signal processor 11 and the control signal supplied from the timing controller 12. Thereafter, the signal line driver 14 applies each of the plurality of signals SsigR to a corresponding one of a plurality of signal lines SGLR (to be described later) of the display section 16, applies each of the plurality of signals SsigG to a corresponding one of a plurality of signal lines SGLG (to be described later), and applies each of the plurality of signals SsigB to a corresponding one of signal lines SGLB (to be described later), thereby supplying the pixel voltages VsigR, VsigG, and VsigB to pixels 20 selected by the scanning line driver 13.

The control signal generator 15 generates a control signal Ssaw having a so-called sawtooth waveform, and supplies the control signal Ssaw to each of the pixels 20 (to be described later) of the display section 16.

The display section 16 displays an image on the basis of the signals SsigR, SsigG, and SsigB, the scanning signal Sscan, and the control signal Ssaw. The display section 16 includes a plurality of pixels 20 arranged in a matrix. Moreover, the display section 16 includes a plurality of scanning lines SCL extending along a row direction (a horizontal direction in FIG. 1), a plurality of signal lines SGLR extending along a column direction (a vertical direction in FIG. 1), a plurality of signal lines SGLG extending along the column direction, and a plurality of signal lines SGLB extending along the column direction. One end of each of the scanning lines SCL is coupled to the scanning line driver 13, and the scanning signal Sscan is applied from the scanning line driver 13 to the one end of the each of the scanning lines SCL. One end of each of the signal lines SGLR, SGLG, and SGLB is coupled to the signal line driver 14. Moreover, the signal SsigR including the pixel voltage VsigR is applied from the signal line driver 14 to the signal line SGLR. The signal SsigG including the pixel voltage VsigG is applied from the signal line driver 14 to the signal line SGLG, and the signal SsigB including the pixel voltage VsigB is applied from the signal line driver 14 to the signal line SGLB. Each of the pixels 20 is coupled to the scanning line SCL and three signal lines SGLR, SGLG, and SGLB.

FIG. 2 illustrates a configuration example of the pixel 20. The pixel 20 includes a light emission controller 30, transistors 21R, 21G, 21B, 22, and 23, current sources 24 and 25, and a light source section 40. The light emission controller 30, the transistors 21R, 21G, 21B, 22, and 23, and the current sources 24 and 25 are included in one chip (a pixel chip), for example. It is to be noted that this is not limitative, and the light emission controllers 30, the transistors 21R, 21G, 21B, 22, and 23 and the current sources 24 and 25 of a plurality of (for example, four) pixels 20 may be included in one chip, for example. Moreover, the light source section 40 is included in one chip (a light source chip).

The light emission controller 30 generates signals PWMR, PWMG, and PWMB, and signals SWG and SWB on the basis of the signals SsigR, SsigG, and SsigB, the scanning signal Sscan, and the control signal Ssaw. The light emission controller 30 includes a signal generator 31 and OR circuits 34 and 35.

The signal generator 31 generates the signals PWMR, PWMG, and PWMB on the basis of the signals SsigR (the pixel voltage VsigR), SsigG (the pixel voltage VsigG), and SsigB (the pixel voltage VsigB), the scanning signal Sscan, and the control signal Ssaw. The signal PWMR indicates a signal having a pulse width PW corresponding to the pixel voltage VsigR, the signal PWMG indicates a signal having a pulse width PW corresponding to the pixel voltage VsigG, and the signal PWMB indicates a signal having a pulse width PW corresponding to the pixel voltage VsigB.

FIG. 3 illustrates a configuration example of the signal generator 31. The signal generator 31 includes sample-and-hold circuits 32R, 32G, and 32B, and comparators 33R, 33G, and 33B.

The sample-and-hold circuit 32R samples the pixel voltage VsigR included in the signal SsigR on the basis of the scanning signal Sscan, and thereafter holds the sampled pixel voltage VsigR and outputs the pixel voltage VsigR. The sample-and-hold circuit 32G samples the pixel voltage VsigG included in the signal SsigG on the basis of the scanning signal Sscan, and thereafter holds the sampled pixel voltage VsigG and outputs the pixel voltage VsigG. The sample-and-hold circuit 32B samples the pixel voltage VsigB included in the signal SsigB on the basis of the scanning signal Sscan, and thereafter holds the sampled pixel voltage VsigB and outputs the pixel voltage VsigB.

The comparator 33R performs comparison between the pixel voltage VsigR and a voltage of the control signal Ssaw, and outputs a result of the comparison as a signal PWMR. The comparator 33R has a positive input terminal supplied with the pixel voltage VsigR and a negative input terminal supplied with the control signal Ssaw. The comparator 33G performs comparison between the pixel voltage VsigG and the control signal Ssaw, and outputs a result of the comparison as the signal PWMG. The comparator 33G has a positive input terminal supplied with the pixel voltage VsigG and a negative input terminal supplied with the control signal Ssaw. The comparator 33B performs comparison between the pixel voltage VsigB and the control signal Ssaw, and outputs a result of the comparison as the signal PWMB. The comparator 33B has a positive input terminal supplied with the pixel voltage VsigB and a negative input terminal supplied with the control signal Ssaw.

FIG. 4 illustrates an operation example of the signal generator 31. FIG. 4 illustrates an operation of generating the signal PWMR on the basis of the signal SsigR, the scanning signal Sscan, and the control signal Ssaw. It is to be noted that the same applies to an operation of generating the signal PWMG on the basis of the signal SsigG, the scanning signal Sscan, and the control signal Ssaw and an operation of generating the signal PWMB on the basis of the signal SsigB, the scanning signal Sscan, and the control signal Ssaw.

The sample-and-hold circuit 32R samples the pixel voltage VsigR included in the signal SsigR, and holds the sampled pixel voltage VsigR. Thereafter, the comparator 33R performs comparison between the pixel voltage VsigR and the voltage of the control signal Ssaw. In a period P1 in which the pixel voltage VsigR is higher than the voltage of the control signal Ssaw, the signal PWMR is in a high level, and in a period P2 in which the pixel voltage VsigR is lower than the voltage of the control signal Ssaw, the signal PWMR is in a low level. A length (the pulse width PW) of the period P1 in which the signal PWMR is in the high level corresponds to the pixel voltage VsigR. In other words, the pulse width PW of the signal PWMR becomes narrower with a decrease in the pixel voltage VsigR, and the pulse width PW of the signal PWMR becomes wider with an increase in the pixel voltage VsigR.

As described above, the signal generator 31 generates the signal PWMR having the pulse width PW corresponding to the pixel voltage VsigR on the basis of the signal SsigR, the scanning signal Sscan, and the control signal Ssaw. Likewise, the signal generator 31 generates the signal PWMG having the pulse width PW corresponding to the pixel voltage VsigG on the basis of the signal SsigG, the scanning signal Sscan, and the control signal Ssaw, and generates the signal PWMB having the pulse width PW corresponding to the pixel voltage VsigB on the basis of the signal SsigB, the scanning signal Sscan, and the control signal Ssaw.

The OR circuit 34 (FIG. 2) determines logical OR (OR) between the signal PWMR and the signal PWMG, and outputs a result of the logical OR as the signal SWG. The OR circuit 35 determines logical OR (OR) between the signal PWMR and the signal PWMB, and outputs a result of the logical OR as the signal SWB.

The transistors 21R, 21G, and 21B each include a P-type MOS (Metal Oxide Semiconductor) transistor. The transistor 21R has a gate supplied with the signal PWMR, a source supplied with a power source voltage VDD, and a drain coupled to sources of the transistors 21G and 21B and a terminal T2 of the light source section 40. The transistor 21G has a gate supplied with the signal PWMG, the source coupled to the drain of the transistor 21R, the source of the transistor 21B, and the terminal T2 of the light source section 40, and a drain coupled to a drain of the transistor 22 and a terminal T3 of the light source section 40. The transistor 21B has a gate supplied with the signal PWMB, the source coupled to the drain of the transistor 21R, the source of the transistor 21G, and the terminal T2 of the light source section 40, and a drain coupled to a drain of the transistor 23 and a terminal T4 of the light source section 40.

The transistors 22 and 23 each include an N-type MOS transistor. The transistor 22 has a gate supplied with the signal SWG, the drain coupled to the drain of the transistor 21G and the terminal T3 of the light source section 40, and a source coupled to one end of the current source 24. The transistor 23 has a gate supplied with the signal SWB, drain coupled to the drain of the transistor 21B and the terminal T4 of the light source section 40, and a source coupled to one end of the current source 25.

The current source 24 includes a so-called constant current source that causes a predetermined current IG to flow from the one end to another end. The current source 24 has the one end coupled to the source of the transistor 22 and the other end grounded. The current source 25 includes a so-called constant current source that causes a predetermined current IB to flow from the one end to another end. The current source 25 has the one end coupled to the source of the transistor 23 and the other end grounded.

The light source section 40 emits red (R) light, green (G) light, and blue (B) light. The light source section 40 has four terminals T1 to T4. The terminal T1 is supplied with the power source voltage VDD, the terminal T2 is coupled to the drain of the transistor 21R and the sources of the transistors 21G and 21B, the terminal T3 is coupled to the drains of the transistors 21G and 22, and the terminal T4 is coupled to the drains of the transistors 21B and 23.

The light source section 40 includes three light-emitting elements 41 (light-emitting elements 41R, 41G, and 41B). The light-emitting element 41R emits red (R) light, the light-emitting element 41G emits green (G) light, and the light-emitting element 41B emits blue (B) light. It is possible to configure the light-emitting elements 41R, 41G, and 41B with use of light-emitting diodes, for example. It is to be noted that the light-emitting elements 41R, 41G, and 41B are not limited thereto, and may be configured with use of organic EL (Electro Luminescence) elements, for example.

The light-emitting element 41R has an anode coupled to the terminal T1, and a cathode coupled to anodes of the light-emitting elements 41G and 41B and the terminal T2. The light-emitting element 41G has the anode coupled to the cathode of the light-emitting element 41R, the anode of the light-emitting element 41B, and the terminal T2, and a cathode coupled to the terminal T3. The light-emitting element 41B has the anode coupled to the cathode of the light-emitting element 41R, the anode of the light-emitting element 41G, and the terminal T2, and a cathode coupled to the terminal T4.

In this example, the light-emitting element 41R has lower light emission efficiency than light emission efficiency of each of the light-emitting elements 41G and 41B. In other words, a drive current necessary for the light-emitting element 41R to emit light with predetermined luminance is larger than a drive current necessary for the light-emitting elements 41G and 41B to emit light with predetermined luminance. In the light source section 40, the light-emitting element 41 having low light emission efficiency (the light-emitting element 41R in this example) of three light-emitting elements 41R, 41G, and 41B is disposed in a path from the terminal T1 to the terminal T2.

The light-emitting element 41R and the transistor 21R are coupled in parallel to each other. Specifically, the anode of the light-emitting element 41R is coupled to the source of the transistor 21R, and the cathode of the light-emitting element 41R is coupled to the drain of the transistor 21R. Accordingly, for example, in a case where the transistor 21R is turned to an OFF state, a combined current of the currents IG and IB flows through the light-emitting element 41R, which causes the light-emitting element 41R to emit light. Moreover, in a case where the transistor 21R is turned to an ON state, the combined current of the currents IG and IB flows through the transistor 21R, which causes the light-emitting element 41R not to emit light.

Likewise, the light-emitting element 41G and the transistor 21G are coupled in parallel to each other. Specifically, the anode of the light-emitting element 41G is coupled to the source of the transistor 21G, and the cathode of the light-emitting element 41G is coupled to the drain of the transistor 21G. Accordingly, for example, in a case where the transistor 21G is turned to the OFF state, the current IG flows through the light-emitting element 41G, which causes the light-emitting element 41G to emit light. Moreover, in a case where the transistor 21G is turned to the ON state, the current IG flows through the transistor 21G, which causes the light-emitting element 41G not to emit light.

Moreover, the light-emitting element 41B and the transistor 21B are coupled in parallel to each other. Specifically, the anode of the light-emitting element 41B is coupled to the source of the transistor 21B, and the cathode of the light-emitting element 41B is coupled to the drain of the transistor 21B. Accordingly, for example, in a case where the transistor 21B is turned to the OFF state, the current IB flows through the light-emitting element 41B, which causes the light-emitting element 41B to emit light. Moreover, in a case where the transistor 21B is turned to the ON state, the current IB flows through the transistor 21B, which causes the light-emitting element 41B not to emit light.

With this configuration, the light-emitting elements 41R, 41G, and 41B in the pixel 20 are independently driven by pulse width modulation. Specifically, the light emission controller 30 generates the signal PWMR having the pulse width PW corresponding to the pixel voltage VsigR, the signal PWMG having the pulse width PW corresponding to the pixel voltage VsigG, and the signal PWMB having the pulse width PW corresponding to the pixel voltage VsigB. Thereafter, the light-emitting element 41R emits light in accordance with the signal PWMR, the light-emitting element 41G emits light in accordance with the signal PWMG, and the light-emitting element 41B emits light in accordance with the signal PWMB.

Here, the light-emitting element 41R corresponds to a specific example of a "first light-emitting element" in the present disclosure. The light-emitting element 41G corresponds to a specific example of a "second light-emitting element" in the present disclosure. The light-emitting element 41B corresponds to a specific example of a "third light-emitting element" in the present disclosure. The terminal T1 corresponds to a specific example of a "first terminal" in the present disclosure. The terminal T2 corresponds to a specific example of a "second terminal" in the present disclosure. The terminal T3 corresponds to a specific example of a "third terminal" in the present disclosure. The terminal T4 corresponds to a specific example of a "fourth terminal" in the present disclosure. The transistor 21R corresponds to a specific example of a "first switch" in the present disclosure. The transistor 21G corresponds to a "second switch" in the present disclosure. The transistor 21B corresponds to a specific example of a "third switch" in the present disclosure. The transistor 22 corresponds to a specific example of a "fourth switch" in the present disclosure. The transistor 23 corresponds to a specific example of a "fifth switch" in the present disclosure. The current source 24 corresponds to a specific example of a "first current source" in the present disclosure. The current source 25 corresponds to a specific example of a "second current source" in the present disclosure. The signal line driver 14 corresponds to a specific example of a "driver" in the present disclosure.

[Operation and Workings]

Next, description is given of an operation and workings of the display device according to the present embodiment.

(Outline of Entire Operation)

First, description is given of an outline of an entire operation of the display device 1 with reference to FIGS. 1 and 2. The image signal processor 11 performs predetermined signal processing on the image signal Spic supplied from outside to generate the image signal Spic2. The timing controller 12 supplies the control signal to each of the scanning line driver 13, the signal line driver 14, and the control signal generator 15 on the basis of the synchronization signal S sync supplied from outside, and performs control to cause the scanning line driver 13, the signal line driver 14, and the control signal generator 15 to operate in synchronization with one another. The scanning line driver 13 sequentially applies the scanning signal Sscan to the plurality of scanning lines SCL of the display section 16 in accordance with the control signal supplied from the timing controller 12 to sequentially select the pixels 20 on a row-by-row basis. The signal line driver 14 generates a plurality of signals Ssig including the pixel voltages Vsig (the pixel voltages VsigR, VsigG, and VsigB), each of which indicates light emission luminance of a corresponding one of the pixels 20, in accordance with the image signal Spic2 supplied from the image signal processor 11 and the control signal supplied from timing controller 12. Thereafter, the signal line driver 14 applies each of the plurality of signals Ssig to a corresponding one of the plurality of signal lines SGL of the display section 16. Thus, the signal line driver 14 supplies the pixel voltage Vsig to the pixels 20 selected by the scanning line driver 13. The control signal generator 15 generates the control signal Ssaw having a so-called sawtooth waveform, and supplies the control signal Ssaw to the display section 16. The display section 16 displays an image on the basis of the signals Ssig, the scanning signal Sscan, and the control signal Ssaw.

(Specific Operation)

In each of the pixels 20, the signal generator 31 generates the signals PWMR, PWMG, and PWMB on the basis of the signals SsigR, SsigG, and SsigB, the scanning signal Sscan, and the control signal Ssaw. The transistor 21R is turned on or off on the basis of the signal PWMR, the transistor 21G is turned on or off on the basis of the signal PWMG, and the transistor 21B is turned on or off on the basis of the signal PWMB. Moreover, the OR circuits 34 and 35 generate the signals SWG and SWB on the basis of the signals PWMR, PWMG, and PWMR. The transistor 22 is turned on or off on the basis of the signal SWG, and the transistor 23 is turned on or off on the basis of the signal SWB. Thereafter, each of the light-emitting elements 41R, 41G, and 41B of the light source section 40 emits light or does not emit light on the basis of turning on or off of the transistors 21R, 21G, 21B, 22, and 23.

FIG. 5 illustrates operations of the transistors 21R, 21G, and 21B, and the light-emitting element 41R, 41G, and 41B on the basis of the signals PWMR, PWMG, and PWMB. In FIG. 5, "H" indicates that a signal is in the high level, and "L" indicates that the signal is in the low level. Moreover, "OFF" indicates that a transistor is in the OFF state, and "ON" indicates that the transistor is in the ON state. Moreover, "light emission" indicates that a light-emitting element emits light, and "non-light emission" indicates that the light-emitting element does not emit light. FIGS. 6A to 6F each schematically illustrate an operation state in the pixel 20.

As illustrated in FIG. 5, in a case where the signals PWMR, PWMG, and PWMB are "HHH", the signals SWG and SWB are "HH". Thus, the transistors 22 and 23 are turned to the ON state, and the transistors 21R, 21G, and 21B are turned to the OFF state. In this case, as illustrated in FIG. 6A, the current IG flows through the light-emitting element 41R, the light-emitting element 41G, the transistor 22, and the current source 24 in this order, and the current IB flows through the light-emitting element 41R, the light-emitting element 41B, the transistor 23, and the current source 25 in this order. Accordingly, a total current of the current IG and the current IB flows through the light-emitting element 41R, the current IG flows though the light-emitting element 41G, and the current IB flows through the light-emitting element 41B. As a result, each of the light-emitting elements 41R, 41G, and 41B emits light.

In a case where the signals PWMR, PWMG, and PWMB are "HHL", the signals SWG and SWB are "HH". Thus, the transistors 21B, 22, and 23 are turned to the ON state, and the transistors 21R and 21G are turned to the OFF state. In this case, as illustrated in FIG. 6B, the current IG flows through the light-emitting element 41R, the light-emitting element 41G, the transistor 22, and the current source 24 in this order, and the current IB flows through the light-emitting element 41R, the transistor 21B, the transistor 23, and the current source 25 in this order. Accordingly, the total current of the current IG and the current IB flows through the light-emitting element 41R, the current IG flows through the light-emitting element 41G, and no current flows through the light-emitting element 41B. As a result, each of the light-emitting elements 41R and 41G emits light, and the light-emitting element 41B does not emit light.

In a case where the signal PWMR, PWMG, and PWMB are "HLH", the signals SWG and SWB are "HH". Thus, the transistors 21G, 21B, 22, and 23 are turned to the ON state, and the transistor 21R is turned to the OFF state. In this case, the total current of the current IG and the current IB flows through the light-emitting element 41R, the current IB flows through the light-emitting element 41B, and no current flows through the light-emitting element 41G. As a result, each of the light-emitting elements 41R and 41B emits light, and the light-emitting element 41G does not emit light.

In a case where the signals PWMR, PWMG, and PWMB are "HLL", the signals SWG and SWB are in "HH". Thus, the transistors 21G, 22, and 23 are turned the ON state, and the transistors 21R and 21B are turned to the OFF state. In this case, as illustrated in FIG. 6C, the current IG flows through the light-emitting element 41R, the transistor 21G, the transistor 22, and the current source 24 in this order, and the current IB flows through the light-emitting element 41R, the transistor 21B, the transistor 23, and the current source 25 in this order. Accordingly, the total current of the current IG and the current IB flows through the light-emitting element 41R, and no current flows through the light-emitting elements 41G and 41B. As a result, the light-emitting element 41R emits light, and each of the light-emitting elements 41G and 41B does not emit light.

In a case where the signals PWMR, PWMG, and PWMB are "LHH", the signals SWG and SWB are "HH". Thus, the transistors 21R, 22, and 23 are turned to the ON state, and the transistors 21G and 21B are turned to the OFF state. In this case, as illustrated in FIG. 6D, the current IG flows through the transistor 21R, the light-emitting element 41G, the transistor 22, and the current source 24 in this order, and the current IB flows through the transistor 21R, the light-emitting element 41B, the transistor 23, and the current source 25 in this order. Accordingly, the current IG flows through the light-emitting element 41G, the current IB flows through the light-emitting element 41B, and no current flows through the light-emitting element 41R. As a result, each of the light-emitting elements 41G and 41B emits light, and the light-emitting element 41R does not emit light.

In a case where the signals PWMR, PWMG, and PWMB are "LHL", the signals SWG and SWB are "HL". Thus, the transistors 21R, 21B, and 22 are turned to the ON state, and the transistors 21G and 23 are turned to the OFF state. In this case, as illustrated in FIG. 6E, the current IG flows through the transistor 21R, the light-emitting element 41G, the transistor 22, and the current source 24 in this order. Accordingly, the current IG flows through the light-emitting element 41G, and no current flows through the light-emitting elements 41R and 41B. As a result, the light-emitting element 41G emits light, and each of the light-emitting elements 41R and 41B does not emit light.

In a case where the signals PWMR, PWMG, and PWMB are "LLH", the signals SWG and SWB are "LH". Thus, the transistors 21R, 21G, and 23 are turned to the ON state, and the transistors 21B and 22 are turned to the OFF state. In this case, the current IB flows through the light-emitting element 41B, and no current flows through the light-emitting elements 41R and 41G. As a result, the light-emitting element 41B emits light, and each of the light-emitting elements 41R and 41G does not emit light.

In a case where the signals PWMR, PWMG, and PWMB are "LLL", the signals SWG and SWB are "LL". Thus, the transistors 21R, 21G, and 21B are turned to the ON state, and the transistors 22 and 23 are turned to the OFF state. In this case, as illustrated in FIG. 6F, no current flows; therefore, each of the light-emitting elements 41R, 41G, and 41B does not emit light.

As described above, in the pixel 20, in a case where the signal PWMR is "H", the transistor 21R is turned to the OFF state; therefore, the combined current of the currents IG and IB flows through the light-emitting element 41R, and the light-emitting element 41R emits light. Moreover, in a case where the signal PWMG is "H", the transistor 21G is turned to the OFF state; therefore, the current IG flows through the light-emitting element 41G, and the light-emitting element 41G emits light. In a case where the signal PWMB is "H", the transistor 21B is turned to the OFF state; therefore, the current IB flows through the light-emitting element 41B, and the light-emitting element 41B emits light.

Moreover, in the pixel 20, in a case where both the signals PWMR and PWMG are "L", the transistor 22 are turned to the OFF state. In other words, in this case, both the transistors 21R and 21G are turned to the ON state, and neither of the light-emitting elements 41R and 41G emits light. Accordingly, in a case where neither of the light-emitting elements 41R and 41G emits light in such a manner, turning the transistor 22 to the OFF state makes it possible to prevent the current IG from flowing, and as a result, it is possible to reduce power consumption.

Likewise, in the pixel 20, in a case where both the signals PWMR and PWMB are "L", the transistor 23 is turned to the OFF state. In other words, both the transistors 21R and 21B are turned to the ON state, and neither of the light-emitting elements 41R and 41B emits light. Accordingly, in a case where neither of the light-emitting elements 41R and 41B emits light in such a manner, turning the transistor 23 to the OFF state makes it possible to prevent the current IB from flowing, and as a result, it is possible to reduce power consumption.

Thus, the light-emitting elements 41R, 41G, and 41B are independently driven on the basis of the signals PWMR, PWMG, and PWMB.

In the pixel 20, the light-emitting elements 41R, 41G, and 41B are independently driven by pulse width modulation. Specifically, the light emission controller 30 generates the signal PWMR having the pulse width PW corresponding to the pixel voltage VsigR, the signal PWMG having the pulse width PW corresponding to the pixel voltage VsigG, and the signal PWMB having the pulse width PW corresponding to the pixel voltage VsigB. Thereafter, the light-emitting elements 41R, 41G, and 41B are independently driven by the pulse width modulation on the basis of these signals PWMR, PWMG, and PWMB.

FIG. 7 illustrates an operation example of the pixel 20, where (A) indicates a waveform of the signal PWMR, (B) indicates a waveform of the signal PWMG, (C) indicates a waveform of the signal PWMB, (D) indicates a waveform of the signal SWG, (E) indicates a waveform of the signal SWB, (F) indicates an operation of the light-emitting element 41R, (G) indicates an operation of the light-emitting element 41G, and (H) indicates an operation of the light-emitting element 41B. In (F) to (H) of FIG. 7, a white color indicates that a light-emitting element emits light, and a black color indicates that the light-emitting element does not emit light.

In this example, at a timing t1, the signal generator 31 of the light emission controller 30 makes a transition of the signal PWMR from the low level to the high level, a transition of the signal PWMG from the low level to the high level, and a transition of the signal PWMB from the low level to the high level ((A) to (C) of FIG. 7). Moreover, the OR circuit 34 of the light emission controller 30 makes a transition of the signal SWG from the low level to the high level in accordance with the transitions of the signals PWMR and PWMG, and the OR circuit 35 makes a transition of the signal SWB from the low level to the high level in accordance with the transitions of the signals PWMR and PWMB ((D) and (E) of FIG. 7). Thus, in a period from the timing t1 to a timing t2, each of the light-emitting elements 41R, 41G, and 41B emits light ((F) to (H) of FIG. 7).

Next, at the timing t2, the signal generator 31 makes a transition of the signal PWMB from the high level to the low level ((C) of FIG. 7). Thus, in a period from the timing t2 to a timing t3, each of the light-emitting elements 41R and 41G emits light, and the light-emitting element 41B does not emit light ((F) to (H) of FIG. 7).

Next, at the timing t3, the signal generator 31 makes a transition of the signal PWMR from the high level to the low level ((A) of FIG. 7). Moreover, the OR circuit 35 makes a transition of the signal SWB from the high level to the low level in accordance with the transition of the signal PWMR ((E) of FIG. 7). Thus, in a period from the timing t3 to a timing t4, the light-emitting element 41G emits light, and each of the light-emitting elements 41R and 41B does not emit light ((F) to (H) of FIG. 7).

Next, at the timing t4, the signal generator 31 makes a transition of the signal PWMG from the high level to the low level ((B) of FIG. 7). Moreover, the OR circuit 34 makes a transition of the signal SWG from the high level to the low level in accordance with the transition of the signal PWMG ((D) of FIG. 7). Thus, in a period from the timing t4 to a timing t5, each of the light-emitting elements 41R, 41G, and 41B does not emit light ((F) to (H) of FIG. 7).

As described above, the light-emitting elements 41R, 41G, and 41B are independently driven by pulse width modulation on the basis of the signals PWMR, PWMG, and PWMB.

In the display device 1, as illustrated in FIG. 2, the light source section 40 has four terminals T1 to T4, the light-emitting element 41R is provided in a path from the terminal T1 to the terminal T2, the light-emitting element 41G is provided in a path from the terminal T2 to the terminal T3, and the light-emitting element 41B is provided in a path from the terminal T2 to the terminal T4. As described above, in the display device 1, the number of terminals of the light source section 40 is four, which makes it possible to make wiring between the light source chip (the light source section 40) and the pixel chip simple as described below in comparison with comparative examples, and as a result, it is possible to make the pixel 20 compact. This makes it possible to increase resolution of the display device 1 and enhance image quality, for example. Moreover, it is possible to reduce a parasitic capacitance of the wiring between the light source chip (the light source section 40) and the pixel chip, which makes it possible to drive the light-emitting elements 41R, 41G, and 41B at high operation speed. Accordingly, it is possible to enhance image quality of the display device 1.

Moreover, in the display device 1, the transistor 22 is provided, and in a case where neither of the light-emitting elements 41R and 41G emits light, the transistor 22 is turned off, which makes it possible to reduce power consumption. Likewise, in the display device 1, the transistor 23 is provided, and in a case where neither of the light-emitting elements 41R and 41B emits light, the transistor 23 is turned off, which makes it possible to reduce power consumption.

Further, in the display device 1, the light-emitting element 41 having low light emission efficiency (the light-emitting element 41R in this example) of the light-emitting elements 41R, 41G, and 41B is disposed in the path from the terminal T1 to the terminal T2 in the light source section 40, which makes it possible to enhance image quality of the display device 1. In other words, a total current of currents generated by two current sources 24 and 25 flows through the path from the terminal T1 to the terminal T2; therefore, in a case where the light-emitting element 41 is disposed in the path from the terminal T1 to the terminal T2, the light-emitting element 41 emits light with higher luminance, as compared with a case where the light-emitting element 41 is disposed in another path. Accordingly, a length of a light emission period of the light-emitting element 41 in the case where the light-emitting element 41 is disposed in the path from the terminal T1 to the terminal T2 is shorter than a length of a light emission period in a case where the light-emitting element 41 is disposed in another path. In particular, in a case where the light-emitting element 41 having high light emission efficiency is disposed in the path from the terminal T1 to the terminal T2, the length of the light emission period of the light-emitting element 41 becomes even shorter. For example, in a case where the length of the light emission period is extremely short, there is a possibility that it is not possible for the light-emitting element 41 to emit light properly, and in this case, there is a possibility that image quality of the display device 1 is decreased. In contrast, in the display device 1, the light-emitting element 41 having low light emission efficiency (the light-emitting element 41R in this example) of the light-emitting elements 41R, 41G, and 41B is disposed in the path from the terminal T1 to the terminal T2, which makes it possible to secure the length of the light emission period of the light-emitting element 41 disposed in the path from the terminal T1 to the terminal T2. Accordingly, it is possible to enhance image quality of the display device 1.

Comparative Examples

Next, description is given of workings of the present embodiment in comparison with some comparative examples.

FIG. 8 illustrates a configuration example of a pixel 50 of a display device 5 according to a first comparative example. The pixel 50 includes a light emission controller 51, transistors 52R, 52G, 52B, and 53 to 55, current sources 56 to 58, and a light source section 59.

The light emission controller 51 generates the signals PWMR, PWMG, and PWMB and the signals SWR, SWG, and SWB on the basis of the signals SsigR, SsigG, and SsigB, the scanning signal Sscan, and the control signal Ssaw.

The transistors 52R, 52G, and 52B each include a P-type MOS transistor. The transistor 52R has a gate supplied with the signal PWMR, a source supplied with the power source voltage VDD, and a drain coupled to a drain of the transistor 53 and a terminal T14 of the light source section 59. The transistor 52G has a gate supplied with the signal PWMG, a source supplied with the power source voltage VDD, and a drain coupled to a drain of the transistor 54 and a terminal T15 of the light source section 59. The transistor 52B has a gate supplied with the signal PWMB, a source supplied with the power source voltage VDD, and a drain coupled to a drain of the transistor 55 and a terminal T16 of the light source section 59.

The transistors 53 to 55 each include an N-type MOS transistor. The transistor 53A has a gate supplied with the signal SWR, the drain coupled to the drain of the transistor 52R and the terminal T14 of the light source section 59, and a source coupled to one end of the current source 56. The transistor 54 has a gate supplied with the signal SWG, the drain coupled to the drain of the transistor 52G and the terminal T15 of the light source section 59, and a source coupled to one end of the current source 57. The transistor 55 has a gate supplied with the signal SWB, the drain coupled to the drain of the transistor 52B and the terminal T16 of the light source section 59, and a source coupled to one end of the current source 58.

The current source 56 includes a so-called constant current source that causes a predetermined current IR to flow from the one end to another end. The current source 56 has the one end coupled to the source of the transistor 53, and the other end grounded. The current source 57 includes a so-called constant current source that causes a predetermined current IG to flow from the one end to another end.

The current source 57 has the one end coupled to the source of the transistor 54, and the other end grounded. The current source 58 includes a so-called constant current source that causes a predetermined current IB to flow from the one end to another end. The current source 58 has the one end coupled to the source of the transistor 55, and the other end grounded.

The light source section 59 has six terminals T11 to T16. The terminals T11 to T13 are supplied with the power source voltage VDD, the terminal T14 is coupled to the drains of the transistors 52R and 53, the terminal T15 is coupled to the drains of the transistors 52G and 54, and the terminal T16 is coupled to the drains of the transistors 52B and 55. The light source section 59 includes three light-emitting elements 59R, 59G, and 59B. The light-emitting element 59R has an anode coupled to the terminal T11, and a cathode coupled to the terminal T14. The light-emitting element 59G has an anode coupled to the terminal T12, and a cathode coupled to the terminal T15. The light-emitting element 59B has an anode coupled to the terminal T13, and a cathode coupled to the terminal T16. The light source section 59 is included in one chip (a light source chip).

In the display device 5 according to this comparative example, three current sources 56, 57, and 58 are provided corresponding to three light-emitting elements 59R, 59G, and 59B, which causes a possibility that power consumption is increased. Moreover, the light source section 59 has the six terminals T11 to T16, which causes a possibility that wiring between the light source chip and the pixel chip is complicated.

In contrast, in the display device 1 according to the present embodiment, only two current sources 24 and 25 are necessary, which makes it possible to suppress power consumption. Moreover, in the display device 1, the number of terminals of the light source section 40 is four, which makes it possible to make wiring between the light source chip and the pixel chip simple and make the pixel 20 compact. As a result, in the display device 1, it is possible to enhance image quality, for example, as described above.

FIG. 9 illustrates a configuration example of a pixel 60 of a display device 6 according to a second comparative example. The pixel 60 has functions of two pixels. The pixel 60 includes a light emission controller 61, transistors 62R, 62G, and 62B, and a light source section 69.

The light emission controller 61 generates signals PWMR1, PWMG1, and PWMB1, signals PWMR2, PWMG2, and PWMB2, and the signals SWR, SWG, and SWB on the basis of the signals SsigR, SsigG, and SsigB, the scanning signal Sscan, and the control signal Ssaw. Specifically, the light emission controller 61 samples a pixel voltage VsigR1 included in the signal SsigR, a pixel voltage VsigG1 included in the signal SsigG, and a pixel voltage VsigB1 included in the signal SsigB on the basis of the scanning signal Sscan, and generates the signal PWMR1 having the pulse width PW corresponding to the pixel voltage VsigR1, the signal PWMG1 having the pulse width PW corresponding to the pixel voltage VsigG1, and the signal PWMB1 having the pulse width PW corresponding to the pixel voltage VsigB1 on the basis of the pixel voltages VsigR1, VsigG1, and VsigB1, and the control signal Ssaw. Moreover, the light emission controller 61 samples a pixel voltage VsigR2 included in the signal SsigR, a pixel voltage VsigG2 included in the signal SsigG, and a pixel voltage VsigB2 included in the signal SsigB on the basis of the scanning signal Sscan, and generates the signal PWMR2 having the pulse width PW corresponding to the pixel voltage VsigR2, the signal PWMG2 having the pulse width PW corresponding to the pixel voltage VsigG2, and the signal PWMB2 having the pulse width PW corresponding to the pixel voltage VsigB2 on the basis of the pixel voltages VsigR2, VsigG2, and VsigB2, and the control signal Ssaw.

The transistor 52R has a gate supplied with the signal PWMR1, and a drain coupled to a source of the transistor 62R, the terminal T14 of the light source section 59, and a terminal T21 of the light source section 69. The transistor 52G has a gate supplied with the signal PWMG1, and a drain coupled to a source of the transistor 62G, the terminal T15 of the light source section 59, and a terminal T22 of the light source section 69. The transistor 52B has a gate supplied with the signal PWMB1, and a drain coupled to a source of the transistor 62B, the terminal T16 of the light source section 59, and a terminal T23 of the light source section 69.

The transistors 62R, 62G, and 62B each include a P-type MOS transistor. The transistor 62R has a gate supplied with the signal PWMR2, the source coupled to the drain of the transistor 52R, the terminal T14 of the light source section 59, the terminal T21 of the light source section 69, a drain coupled to the drain of the transistor 53 and a terminal T24 of the light source section 69. The transistor 62G has a gate supplied with the signal PWMG2, the source coupled to the drain of the transistor 52G, the terminal T15 of the light source section 59, and the terminal T22 of the light source section 69, and a drain coupled to the drain of the transistor 54 and a terminal T25 of the light source section 69. The transistor 62B has a gate supplied with the signal PWMB2, the source coupled to the drain of the transistor 52B, the terminal T16 of the light source section 59, and a terminal T23 of the light source section 69, and a drain coupled to the drain of the transistor 55 and a terminal T26 of the light source section 69.

The drain of the transistor 53 is coupled to the drain of the transistor 62R and the terminal T24 of the light source section 69. The drain of the transistor 54 is coupled to the drain of the transistor 62G and the terminal T25 of the light source section 69. The drain of the transistor 55 is coupled to the drain of the transistor 62B and the terminal T26 of the light source section 69.

The light source section 59 has the terminal T14 coupled to the drain of the transistor 52R, the source of the transistor 62R, and the terminal T21 of the light source section 69, the terminal T15 coupled to the drain of the transistor 52G, the source of the transistor 62G, and the terminal T22 of the light source section 69, and the terminal T16 coupled to the drain of the transistor 52B, the source of the transistor 62B, and the terminal T23 of the light source section 69.

The light source section 69 has the six terminals T21 to T26. The terminal T21 is coupled to the drain of the transistor 52R, the source of the transistor 62R, and the terminal T14 of the light source section 59, and the terminal T22 is coupled to the drain of the transistor 52G, the source of the transistor 62G, and the terminal T15 of the light source section 59. The terminal T23 is coupled to the drain of the transistor 52B, the source of the transistor 62B, and the terminal T16 of the light source section 59. Moreover, the terminal T24 is coupled to the drains of the transistors 62R and 53, the terminal T25 is coupled to the drains of the transistors 62G and 54, and the terminal T26 is coupled to the drains of the transistors 62B and 55. The light source section 69 includes three light-emitting elements 69R, 69G, and 69B. The light-emitting element 69R has an anode coupled to the terminal T21, and a cathode coupled to the terminal T24. The light-emitting element 69G has an anode coupled to the terminal T22, and a cathode coupled to the terminal T25. The light-emitting element 69B has an anode coupled to the terminal T23, and a cathode coupled to the terminal T26. The light source section 69 is included in one chip (a light source chip).

In the display device 6 according to this comparative example, each of the light source sections 59 and 69 includes six terminals, which causes a possibility that wiring between two light source chips and wiring between each of the light source chips and the pixel chip are complicated. Moreover, for example, in a case where a so-called open fault occurs in a path from the terminal T11 to the terminal T14 of the light source section 59 corresponding to a first pixel, there is a possibility that the light-emitting element 59R of the light source section 69 corresponding to a second pixel is not able to emit light.

In contrast, in the display device 1 according to the present embodiment, the number of terminals of the light source section 40 is four, which makes it possible to make wiring between the light source chip and the pixel chip simple and make the pixel 20 compact. As a result, in the display device 1, it is possible to enhance image quality as described above, for example. Moreover, in the display device 1, each of the pixels has an independent configuration, which makes it possible to reduce a possibility that occurrence of an open fault in a certain pixel affects other pixels.

FIG. 10 illustrates a configuration example of a pixel 70 of a display device 7 according to a third comparative example. The pixel 70 includes a light emission controller 71, transistors 72R, 72G, 72B, and 73 to 75, current sources 76 to 78, and a light source section 79.

The light emission controller 71 generates the signals PWMR, PWMG, and PWMB and signals SWR1, SWG1, and SWB1 on the basis of the signals SsigR, SsigG, and SsigB, the scanning signal Sscan, and the control signal Ssaw.

The transistors 72R, 72G, and 72B each include a P-type MOS transistor. The transistor 72R has a gate supplied with the signal PWMR, a source supplied with the power source voltage VDD, and a drain coupled to a source of the transistor 72G, a drain of the transistor 73, and a terminal T32 of the light source section 79. The transistor 72G has a gate supplied with the signal PWMG, a source coupled to drains of the transistors 72R and 73, and a terminal T32 of the light source section 79, and a drain coupled to a source of the transistor 72B, a drain of the transistor 74, and a terminal T33 of the light source section 79. The transistor 72B has a gate supplied with the signal PWMB, a source coupled to drains of the transistors 72G and 74, and a terminal T33 of the light source section 79, and a drain coupled to a drain of the transistor 75 and a terminal T34 of the light source section 79.

The transistors 73 to 75 each include an N-type MOS transistor. The transistor 73 has a gate supplied with the signal SWR1, the drain coupled to the drain of the transistor 72R, the source of the transistor 72G, and the terminal T32 of the light source section 79, and a source coupled to one end of the current source 77. The transistor 74 has a gate supplied with the signal SWG1, the drain coupled to the drain of the transistor 72G, the source of the transistor 72B, and the terminal T33 of the light source section 79, and a source coupled to the one end of the current source 77. The transistor 75 has a gate supplied with the signal SWB1, the drain coupled to the drain of the transistor 72B and the terminal T34 of the light source section 79, and a source coupled to one end of the current source 78.

The current source 78 includes a so-called constant current source that causes a predetermined current IB to flow from the one end to another end. The current source 78 has the one end coupled to the source of the transistor 75, and the other end grounded. The current source 77 includes a so-called constant current source that causes a predetermined current IBG (=IG−IB) to flow from the one end to another end. The current source 77 has the one end coupled to the source of the transistor 74, and the other end grounded. The current source 76 includes a so-called constant current source that causes a predetermined current IRG (=IR−IG) to flow from one end to another end. The current source 76 has the one end coupled to the source of the transistor 73, and the other end grounded.

The light source section 79 has four terminals T31 to T34. The terminal T31 is supplied with the power source voltage VDD. The terminal T32 is coupled to the drains of the transistors 72R and 73 and the source of the transistor 72G. The terminal T33 is coupled to the drains of the transistors 72G and 74 and the source of the transistor 72B. The terminal T34 is coupled to the drains of the transistors 72B and 75. The light source section 79 includes three light-emitting elements 79R, 79G, and 79B. The light-emitting element 79R has an anode coupled to the terminal T31, and a cathode coupled to an anode of the light-emitting element 79G and the terminal T32. The light-emitting element 79G has the anode coupled to the cathode of the light-emitting element 79R and the terminal T32, and a cathode coupled to an anode of the light-emitting element 79B and the terminal T33. The light-emitting element 79B has the anode coupled to the cathode of the light-emitting element 79G and the terminal T33, and a cathode coupled to the terminal T34. The light source section 79 is included in one chip (a light source chip).

In the display device 7 according to this comparative example, three light-emitting elements 79R, 79G, and 79B are coupled in series to one another; therefore, in some cases, the power source voltage VDD may be forced to be increased. As a result, there is a possibility that power consumption is increased. Moreover, in the display device 7, for example, the current IGB (=IG−IB) generated by the current source 77 does not contribute to light emission of the light-emitting element 79B, and does not contribute to the current IRG (=IR−IG) generated by the current source 76 in a similar manner, which results in waste of the currents.

In contrast, in the display device 1 according to the present embodiment, as illustrated in FIG. 2, the light-emitting element 41R is provided in the path from the terminal T1 to the terminal T2, the light-emitting element 41G is provided in the path from the terminal T2 to the terminal T3, and the light-emitting element 41B is provided in the path from the terminal T2 to the terminal T4. Accordingly, in the display device 1, two light-emitting elements 41 are coupled in series to each other, which makes it possible to suppress the power source voltage VDD. As a result, in the display device 1, it is possible to suppress power consumption. Moreover, in the display device 1, for example, the current IG generated by the current source 24 contributes to light emission of the light-emitting elements 41R and 41G, and the current IB generated by the current source 25 contributes to light emission of the light-emitting elements 41R and 41B in a similar manner, which makes it possible to use the currents efficiently.

[Effects]

As described above, in the present embodiment, the number of terminals of the light source section is four, which makes it possible to make wiring between the light source chip and the pixel chip simple, and as a result, it is possible to make the pixel compact. This makes it possible to enhance image quality of the display device, for example.

Modification Example 1

In the foregoing embodiment, one light-emitting element 41R is provided in the path from the terminal T1 to the terminal T2, one light-emitting element 41G is provided in the path from the terminal T2 to the terminal T3, and one light-emitting element 41B is provided in the path from the terminal T2 to the terminal T4; however, this is not limitative. Alternatively, for example, as with a light source section 40A illustrated in FIG. 11, a plurality of (three in this example) light-emitting elements may be provided in the path from the terminal T1 to the terminal T2, a plurality of (three in this example) light-emitting elements may be provided in the path from the terminal T2 to the terminal T3, and a plurality of (three in this example) light-emitting elements may be provided in the path from the terminal T2 to the terminal T4. In this example, three light-emitting elements 41R, 42R, and 43R coupled in series to one another are provided in the path from the terminal T1 to the terminal T2, three light-emitting elements 41G, 42G, and 43G coupled in series to one another are disposed in the path from the terminal T2 to the terminal T3, and three light-emitting elements 41B, 42B, and 43B coupled in series to one another are disposed in the path from the terminal T2 to the terminal T4.

In the light source section 40A, the numbers of light-emitting elements provided in the three paths are the same as one another; however, this is not limitative. Alternatively, for example, as with a light source section 40B illustrated in FIG. 12, the numbers of light-emitting elements in the paths may not be equal to one another. In this example, two light-emitting elements 41R and 42R coupled in series to each other are disposed in the path from the terminal T1 to the terminal T2, three light-emitting elements 41G, 42G, and 43G coupled in series to one another are disposed in the path from the terminal T2 to the terminal T3, and three light-emitting elements 41B, 42B, and 43B coupled in series to one another are disposed in the path from the terminal T2 to the terminal T4.

Moreover, in the light source sections 40A and 40B, a plurality of light-emitting elements is coupled in series to one another in each of the paths; however, this is not limitative. Alternatively, for example, as with a light source section 40C illustrated in FIG. 13, a plurality of (two in this example) light-emitting elements coupled in parallel to one another may be provided in the path from the terminal T1 to the terminal T2, a plurality of (two in this example) light-emitting elements coupled in parallel to one another may be provided in the path from the terminal T2 to the terminal T3, and a plurality of (two in this example) light-emitting elements coupled in parallel to one another may be provided in the path from the terminal T2 to the terminal T4. In this example, two light-emitting elements 41R and 42R coupled in parallel to each other are disposed in the path from the terminal T1 to the terminal T2, two light-emitting elements 41G and 42G coupled in parallel to each other are disposed in the path from the terminal T2 to the terminal T3, and two light-emitting elements 41B and 42B coupled in parallel to each other are disposed in the path from the terminal T2 to the terminal T4.

Even in this case, for example, as with a light source section 40D illustrated in FIG. 14, the numbers of light-emitting elements in the paths may not be equal to one another. In this example, two light-emitting elements 41R and 42R coupled in parallel to each other are disposed in the path from the terminal T1 to the terminal T2, one light-emitting element 41G is disposed in the path from the terminal T2 to the terminal T3, and one light-emitting element 41B is disposed in the path from the terminal T2 to the terminal T4.

Modification Example 2

In the foregoing embodiment, the light source section 40 includes the light-emitting element 41R that emits red (R) light, the light-emitting element 41G that emits green (G) light, and the light-emitting element 41B that emits blue (B) light; however, this is not limitative. For example, a light-emitting element that emits yellow or white may be further provided in addition to the light-emitting elements 41R, 41G, and 41B. A display device 1E including a light-emitting element 41Y of yellow (Y) is described in detail below.

FIG. 15 illustrates a configuration example of the display device 1E. The display device 1E includes an image signal processor 11E, a signal line driver 14E, and a display section 16E.

The image signal processor 11E performs predetermined signal processing on the image signal Spic supplied from outside to generate an image signal Spic3. The image signal processor 11E has a function of converting luminance information of three colors (red, green, and blue) into luminance information of four colors (red, green, blue and yellow).

The signal line driver 14E generates the plurality of signals SsigR including the pixel voltage VsigR, the plurality of signals SsigG including the pixel voltage VsigG, the plurality of signals SsigB including the pixel voltage VsigB, and a plurality of signals SsigY including a pixel voltage VsigY in accordance with the image signal Spic3 supplied from the image signal processor 11E and the control signal supplied from the timing controller 12. Thereafter, the signal line driver 14E applies each of the plurality of signals SsigR to a corresponding one of the plurality of signal lines SGLR of the display section 16E, applies each of the plurality of signals SsigG to a corresponding one of the plurality of signal lines SGLG, applies each of the plurality of signals SsigB to a corresponding one of the plurality of signal lines SGLB, and applies each of the plurality of signals SsigY to a corresponding one of a plurality of signal lines SGLY (to be described later), which causes the scanning line driver 13 to supply the pixel voltages VsigR, VsigG, VsigB, and VsigY to a selected pixel 80.

The display section 16E displays an image on the basis of the signals SsigR, SsigG, SsigB, and SsigY, the scanning signal Sscan, and the control signal Ssaw. The display section 16E includes a plurality of pixels 80 arranged in a matrix. Moreover, the display section 16E includes the plurality of scanning lines SCL extending along the row direction (the horizontal direction in FIG. 1), the plurality of signal lines SGLR extending along the column direction (the vertical direction in FIG. 1), the plurality of signal lines SGLG extending along the column direction, the plurality of signal lines SGLB extending along the column direction, and the plurality of signal lines SGLY extending along the column direction. One end of each of the signal lines SGLR, SGLG, SGLB, and SGLY is coupled to the signal line driver 14E. Moreover, the signal SsigR including the pixel voltage VsigR is applied from the signal line driver 14E to the signal line SGLR. The signal SsigG including the pixel voltage VsigG is applied from the signal line driver 14E to the signal line SGLG. The signal SsigG including the pixel voltage VsigG is applied from the signal line driver 14E to the signal line SGLB. The signal SsigY including the pixel voltage VsigY is applied from the signal line driver 14E to the signal line SGLY. Each of the pixels 80 is coupled to the scanning line SCL and four signal lines SGLR, SGLG, SGLB, and SGLY.

FIG. 16 illustrates a configuration example of the pixel 80. The pixel 80 includes a light emission controller 30E, transistors 21Y and 84, a current source 86, and a light source section 40E. The light source section 40E is included in one chip (a light source chip).

The light emission controller 30E generates signals PWMR, PWMG, PWMB, and PWMY and signals SWG, SWB, and SWY on the basis of the signals SsigR, SsigG, SsigB, and SsigY, the scanning signal Sscan, and the control signal Ssaw. The light emission controller 30E includes a signal generator 31E and an OR circuit 36.

The signal generator 31E generates the signals PWMR, PWMG, PWMB, and PWMY on the basis of the signals SsigR (the pixel voltage VsigR), SsigG (the pixel voltage VsigG), SsigB (the pixel voltage VsigB), and SsigY (the pixel voltage VsigY), the scanning signal Sscan, and the control signal Ssaw. The signal PWMY indicates a signal having the pulse width PW corresponding to the pixel voltage VsigY.

The OR circuit 36 determines logical OR (OR) between the signal PWMR and the signal PWMY, and outputs a result of the logical OR as the signal SWY.

The transistor 21Y includes a P-type MOS transistor. The transistor 21Y has a gate supplied with the signal PWMY, a source coupled to the drain of the transistor 21R, the sources of the transistors 21G and 21B, and the terminal T2 of the light source section 40E, and a drain coupled to a drain of the transistor 84 and the terminal T5 of the light source section 40E.

The transistor 84 includes an N-type MOS transistor. The transistor 84 has a gate supplied with the signal SWY, the drain coupled to the drain of the transistor 21Y and the terminal T5 of the light source section 40E, and a source coupled to one end of the current source 86.

The current source 86 is a so-called constant current source that causes a predetermined current IY to flow from the one end to another end. The current source 86 has the one end coupled to the source of the transistor 84, and the other end grounded.

The light source section 40E emits red (R) light, green (G) light, blue (B) light, and yellow (Y) light. The light source section 40E has five terminals T1 to T5. The terminal T5 is coupled to drains of the transistors 21Y and 84. The light source section 40E includes four light-emitting elements 41 (the light-emitting elements 41R, 41G, 41B, and 41Y). The light-emitting element 41Y emits yellow (Y) light. It is possible to configure the light-emitting element 41Y with use of a light-emitting element that emits blue (B) light and a phosphor that converts the blue light into yellow (Y) light, for example. The light-emitting element 41Y has an anode coupled to the cathode of the light-emitting element 41R, the anodes of the light-emitting elements 41G and 41B, and the terminal T2, and a cathode coupled to the terminal T5.

Modification Example 3

In the foregoing embodiment, as illustrated in FIG. 2, the light-emitting element 41R has the anode coupled to the terminal T1, and the cathode coupled to the terminal T2, the light-emitting element 41G has the anode coupled to the terminal T2, and the cathode coupled to the terminal T3, the light-emitting element 41B has the anode coupled to the terminal T2, and the cathode coupled to the terminal T4; however, this is not limitative. A display device 1F according to the present modification example is described in detail below.

FIG. 17 illustrates a configuration example of a pixel 120 of the display device 1F. The pixel 120 includes a light emission controller 130, current sources 124 and 125, transistors 121R, 121G, 121B, 122, and 123, and a light source section 140. The light source section 140 is included in one chip (a light source chip).

The light emission controller 130 generates the signals PWMR, PWMG, and PWMB and the signals SWG and SWB on the basis of the signals SsigR, SsigG, and SsigB, the scanning signal Sscan, and the control signal Ssaw. The light emission controller 130 includes a signal generator 131 and AND circuits 134 and 135.

The signal generator 131 generates signals PWMR, PWMG, and PWMB on the basis of the signals SsigR (the pixel voltage VsigR), SsigG (the pixel voltage VsigG), and SsigB (the pixel voltage VsigB), the scanning signal Sscan, and the control signal Ssaw.

FIG. 18 illustrates a configuration example of the signal generator 131. The signal generator 131 includes comparators 33R, 33G, and 33B. The comparator 33R has a positive input terminal supplied with the control signal Ssaw, and a negative input terminal supplied with the pixel voltage VsigR. The comparator 33G has a positive input terminal supplied with the control signal Ssaw, and a negative input terminal supplied with the pixel voltage VsigG. The comparator 33B has a positive input terminal supplied with the control signal Ssaw, and a negative input terminal supplied with the pixel voltage VsigB.

FIG. 19 illustrates an operation example of the signal generator 131. The comparator 33R performs comparison between the pixel voltage VsigR and the voltage of the control signal Ssaw. In a period P11 in which the pixel voltage VsigR is higher than the voltage of the control signal Ssaw, the signal PWMR is in the low level, and in a period in which the pixel voltage VsigR is lower than the voltage of the control signal Ssaw, the signal PWMR is in the high level. A length (the pulse width PW) of the period P11 in which the signal PWMR is in the low level corresponds to the pixel voltage VsigR. In other words, the pulse width PW of the signal PWMR becomes narrower with a decrease in the pixel voltage VsigR, and the pulse width PW of the signal PWMR becomes wider with an increase in the pixel voltage VsigR.

The AND circuit 134 (FIG. 17) determines logical AND (AND) between the signal PWMR and the signal PWMG, and outputs a result of the logical AND as the signal SWG. The AND circuit 135 determines logical AND (AND) between the signal PWMR and the signal PWMB, and outputs a result of the logical AND as the signal SWB.

The current source 124 is a so-called constant current source that causes a predetermined current IG to flow from one end to another end. The current source 124 has the one end supplied with the power source voltage VDD, and the other end coupled to a source of the transistor 122. The current source 125 is a so-called constant current source that causes a predetermined current IB to flow from one end to another end. The current source 125 has the one end supplied with the power source voltage VDD, and the other end coupled to a source of the transistor 123.

The transistors 122 and 123 each include a P-type MOS transistor. The transistor 122A has a gate supplied with the signal SWG, the source coupled to the other end of the current source 124, and a drain coupled to a drain of the transistor 121G and the terminal T3 of the light source section 140. The transistor 123 has a gate supplied with the signal SWB, the source coupled to the other end of the current source 125, and a drain coupled to a drain of the transistor 121B and the terminal T4 of the light source section 140.

The transistors 121R, 121G, and 121B each include an N-type MOS transistor. The transistor 121G has a gate supplied with the signal PWMG, the drain coupled to the drain of the transistor 122 and the terminal T3 of the light source section 140, and a source coupled to a source of the transistor 121B, a drain of the transistor 121R, and the terminal T2 of the light source section 140. The transistor 121B has a gate supplied with the signal PWMB, the drain coupled to the drain of the transistor 123 and the terminal T4 of the light source section 140, the source coupled to the source of the transistor 121G, the drain of the transistor 121R, and the terminal T2 of the light source section 140. The transistor 121R has a gate supplied with the signal PWMR, the drain coupled to the sources of the transistors 121G and 121B and the terminal T2 of the light source section 140, and a source grounded.

The light source section 140 has the terminal T3 coupled to the drains of the transistors 122 and 121G, the terminal T4 coupled to the drains of the transistors 123 and 121B, the terminal T2 coupled to the sources of the transistors 121G and 121B and the drain of the transistor 121R, and the terminal T1 grounded. The light-emitting element 41G has the anode coupled to the terminal T3, and the cathode coupled to the cathode of the light-emitting element 41B, the anode of the light-emitting element 41R, and the terminal T2. The light-emitting element 41B has the anode coupled to the terminal T4, and the cathode coupled to the cathode of the light-emitting element 41G, the anode of the light-emitting element 41R, and the terminal T2. The light-emitting element 41R has the anode coupled to the cathodes of the light-emitting elements 41G and 41B and the terminal T2, and the cathode coupled to the terminal T1. In this example, the light-emitting element 41R has light emission efficiency lower than light emission efficiency of each of the light-emitting elements 41G and 41B.

FIG. 20 illustrates an operation example of the pixel 120. In this example, at a timing T1, the signal generator 131 of the light emission controller 130 makes a transition of the signal PWMR from the high level to the low level, makes a transition of the signal PWMG from the high level to the low level, and makes a transition of the signal PWMB from the high level to the low level ((A) to (C) of FIG. 20). Moreover, the AND circuit 134 of the light emission controller 130 makes a transition of the signal SWG from the high level to the low level in accordance with transitions of the signals PWMR and PWMG, and the AND circuit 135 makes a transition of the signal SWB from the high level to the low level in accordance with the transitions of the signals PWMR and PWMB ((D) and (E) of FIG. 20). Thus, in a period from the timing t11 to a timing t12, each of the light-emitting elements 41R, 41G, and 41B emits light ((G) to (H) of FIG. 20).

Next, at the timing t12, the signal generator 131 makes a transition of the signal PWMB from the low level to the high level ((C) of FIG. 20). Thus, in a period from the timing t12 to a timing t13, each of the light-emitting elements 41R and 41G emits light, and the light-emitting element 41B does not emit light ((G) to (H) of FIG. 20).

Next, at the timing t13, the signal generator 131 makes a transition of the signal PWMR from the low level to the high level ((A) of FIG. 20). Moreover, the AND circuit 135 makes a transition of the signal SWB from the low level to the high level in accordance with the transition of the signal PWMR ((E) of FIG. 20). Thus, in a period from the timing t13 to a timing t14, the light-emitting element 41G emits light, and each of the light-emitting elements 41R and 41B does not emit light ((G) to (H) of FIG. 20).

Next, at the timing t14, the signal generator 131 makes a transition of the signal PWMG from the low level to the high level ((B) of FIG. 20). Moreover, the AND circuit 134 makes a transition of the signal SWG from the low level to the high level in accordance with the transition of the signal PWMG ((D) of FIG. 20). Thus, in a period from the timing t14 to a timing t15, each of the light-emitting elements 41R, 41G, and 41B does not emit light ((G) to (H) of FIG. 20).

Other Modification Examples

Moreover, two or more of these modification examples may be combined.

Although the description has been given with reference to the embodiment and some modification examples, the present technology is not limited to the foregoing embodiment, etc., and may be modified in a variety of ways.

For example, in the foregoing embodiment, etc., the light-emitting element 41R that emits red light is provided in the path from the terminal T1 to the terminal T2, the light-emitting element 41G that emits green light is provided in the path from the terminal T2 to the terminal T3, and the light-emitting element 41B that emits blue light is provided in the path from the terminal T2 to the terminal T4; however, this is not limitative, and it is possible to optionally dispose three light-emitting elements 41R, 41G, and 41B in three paths. Specifically, for example, the light-emitting element 41G that emits green light may be provided in the path from the terminal T1 to the terminal T2, the light-emitting element 41B that emits blue light may be provided in the path from the terminal T2 to the terminal T3, and the light-emitting element 41R that emits red light may be provided in the path from the terminal T2 to the terminal T4. Moreover, for example, the light-emitting element 41B that emits blue light may be provided in the path from the terminal T1 to the terminal T2, the light-emitting element 41R that emits red light may be provided in the path from the terminal T2 to the terminal T3, and the light-emitting element 41G that emits green light may be provided in the path from the terminal T2 to the terminal T4.

Moreover, for example, in the foregoing embodiment, etc., the light-emitting element 41 having low light emission efficiency of the light-emitting elements 41R, 41G, and 41B is disposed in the path from the terminal T1 to the terminal T2; however, this is not limitative. Alternatively, the light-emitting element 41 other than the light-emitting element 41 having the lowest light emission efficiency of the light-emitting elements 41R, 41G, and 41B may be disposed in the path from the terminal T1 to the terminal T2.

It is to be noted that the effects described herein are merely illustrative and non-limiting, and other effects may be included.

It is to be noted that the present technology may have the following configurations.

(1)

A light source device including:

a first terminal, a second terminal, a third terminal, and a fourth terminal;

a first light-emitting element that is disposed in a first path from the first terminal to the second terminal, includes a first electrode of a first type and a second electrode of a second type coupled to the second terminal, and emits first basic color light;

a second light-emitting element that is disposed in a second path from the second terminal to the third terminal, includes a first electrode of the first type coupled to the second terminal and a second electrode of the second type, and emits second basic color light; and a third light-emitting element that is disposed in a third path from the second terminal to the fourth terminal, includes a first electrode of the first type coupled to the second terminal and a second electrode of the second type, and emits third basic color light.

(2)

The light source device according to (1), in which light emission efficiency of the first light-emitting element is lower than light emission efficiency of the second light-emitting element and light emission efficiency of the third light-emitting element.

(3)

The light source device according to (1) or (2), further including:

a fifth terminal; and a fourth light-emitting element that is disposed in a fourth path from the second terminal to the fifth terminal, includes a first electrode of the first type coupled to the second terminal and a second electrode of the second type, and emits non-basic color light.

(4)

The light source device according to any one of (1) to (3), in which the first electrode of the first light-emitting element is coupled to the first terminal.

(5)

The light source device according to any one of (1) to (3), further including a fifth light-emitting element that is disposed in the first path, includes a first electrode of the first type and a second electrode of the second type coupled to the first electrode of the first light-emitting element, and emits the first basic color light.

(6)

The light source device according to any one of (1) to (4), further including a fifth light-emitting element that emits the first basic color light, in which the first path includes a first sub-path from the first terminal to the second terminal and a second sub-path from the first terminal to the second terminal, the first light-emitting element is disposed in the first sub-path, and the fifth light-emitting element is disposed in the second sub-path, and includes a first electrode of the first type and a second electrode of the second type coupled to the second terminal.

(7)

The light source device according to any one of (1) to (6), in which the second electrode of the second light-emitting element is coupled to the third terminal, and the second electrode of the third light-emitting element is coupled to the fourth terminal.

(8)

The light source device according to any one of (1) to (6), further including:

a sixth light-emitting element that is disposed in the second path, includes a first electrode of the first type coupled to the second electrode of the second light-emitting element and a second electrode of the second type, and emits the second basic color light; and a seventh light-emitting element that is disposed in the third path, includes a first electrode of the first type coupled to the second electrode of the third light-emitting element and a second electrode of the second type, and emits the third basic color light.

(9)

The light source device according to any one of (1) to (8), in which each of the first electrode of the first light-emitting element, the first electrode of the second light-emitting element, the first electrode of the third light-emitting element serves as an anode electrode, and each of the second electrode of the first light-emitting element, the second electrode of the second light-emitting element, and the second electrode of the third light-emitting element serves as a cathode electrode.

(10)

The light source device according to any one of (1) to (8), in which each of the first electrode of the first light-emitting element, the first electrode of the second light-emitting element, the first electrode of the third light-emitting element serves as a cathode electrode, and each of the second electrode of the first light-emitting element, the second electrode of the second light-emitting element, and the second electrode of the third light-emitting element serves as an anode electrode.

(11)

A light-emitting device including:

a first light-emitting element that is disposed in a first path from a first terminal to a second terminal, includes a first electrode of a first type and a second electrode of a second type coupled to the second terminal, and emits first basic color light;

a second light-emitting element that is disposed in a second path from the second terminal to a third terminal, includes a first electrode of the first type coupled to the second terminal and a second electrode of the second type, and emits second basic color light;

a third light-emitting element that is disposed in a third path from the second terminal to a fourth terminal, includes a first electrode of the first type coupled to the second terminal and a second electrode of the second type, and emits third basic color light;

a first switch that is turned to an ON state to couple the first terminal and the second terminal to each other;

a second switch that is turned to the ON state to couple the second terminal and the third terminal to each other;

a third switch that is turned to the ON state to couple the second terminal and the fourth terminal to each other;

a first current source coupled to the third terminal;

a second current source coupled to the fourth terminal; and a light emission controller that controls operations of the first switch, the second switch, and the third switch.

(12)

The light-emitting device according to (11), in which the light emission controller controls each of lengths of a period in which the first switch is in the ON state, a period in which the second switch is in the ON state, and a period in which the third switch is in the ON state.

(13)

The light-emitting device according to (11) or (12), further including:

a fourth switch that is turned to the ON state to couple the third terminal and the first current source to each other; and a fifth switch that is turned to the ON state to couple the fourth terminal and the second current source to each other, in which the light emission controller also controls operations of the fourth switch and the fifth switch.

(14)

The light-emitting device according to (13), in which the light emission controller turns the fourth switch to an OFF state in a case where both the first switch and the second switch are in the ON state, and the light emission controller turns the fifth switch to the OFF state in a case where both the first switch and the third switch are in the ON state.

(15)

A display device including:

a plurality of light-emitting devices, each of the light-emitting devices including:

a first light-emitting element that is disposed in a first path from a first terminal to a second terminal, includes a first electrode of a first type and a second electrode of a second type coupled to the second terminal, and emits first basic color light, a second light-emitting element that is disposed in a second path from the second terminal to a third terminal, includes a first electrode of the first type coupled to the second terminal and a second electrode of the second type, and emits second basic color light, a third light-emitting element that is disposed in a third path from the second terminal to a fourth terminal, includes a first electrode of the first type coupled to the second terminal and a second electrode of the second type, and emits third basic color light, a first switch that is turned to an ON state to couple the first terminal and the second terminal to each other, a second switch that is turned to the ON state to couple the second terminal and the third terminal to each other, a third switch that is turned to the ON state to couple the second terminal and the fourth terminal to each other, a first current source coupled to the third terminal, a second current source coupled to the fourth terminal, and a light emission controller that controls operations of the first switch, the second switch, and the third switch.

(16)

The display device according to (15), further including a driver that supplies a first pixel signal, a second pixel signal, and a third pixel signal to each of the light-emitting devices, in which the light emission controller controls a length of a period in which the first switch is in the ON state on the basis of the first pixel signal, the light emission controller controls a length of a period in which the second switch is in the ON state on the basis of the second pixel signal, and the light emission controller controls a length of a period in which the third switch is in the ON state on the basis of the third pixel signal.

This application claims the benefit of Japanese priority Patent Application JP2016-253603 filed with the Japan Patent Office on Dec. 27, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light source device comprising:
   a first terminal, a second terminal, a third terminal, and a fourth terminal;
   a first light-emitting element that is disposed in a first path from the first terminal to the second terminal, includes a first electrode of a first type and a second electrode of a second type coupled to the second terminal, and emits first basic color light;
   a second light-emitting element that is disposed in a second path from the second terminal to the third terminal, includes a first electrode of the first type coupled to the second terminal and a second electrode of the second type, and emits second basic color light; and
   a third light-emitting element that is disposed in a third path from the second terminal to the fourth terminal, includes a first electrode of the first type coupled to the second terminal and a second electrode of the second type, and emits third basic color light.

2. The light source device according to claim 1, wherein light emission efficiency of the first light-emitting element is lower than light emission efficiency of the second light-emitting element and light emission efficiency of the third light-emitting element.

3. The light source device according to claim 1, further comprising:
   a fifth terminal; and
   a fourth light-emitting element that is disposed in a fourth path from the second terminal to the fifth terminal, includes a first electrode of the first type coupled to the second terminal and a second electrode of the second type, and emits non-basic color light.

4. The light source device according to claim 1, wherein the first electrode of the first light-emitting element is coupled to the first terminal.

5. The light source device according to claim 1, further comprising a fifth light-emitting element that is disposed in the first path, includes a first electrode of the first type and a second electrode of the second type coupled to the first electrode of the first light-emitting element, and emits the first basic color light.

6. The light source device according to claim 1, further comprising a fifth light-emitting element that emits the first basic color light, wherein
   the first path includes a first sub-path from the first terminal to the second terminal and a second sub-path from the first terminal to the second terminal,
   the first light-emitting element is disposed in the first sub-path, and
   the fifth light-emitting element is disposed in the second sub-path, and includes a first electrode of the first type and a second electrode of the second type coupled to the second terminal.

7. The light source device according to claim 1, wherein
   the second electrode of the second light-emitting element is coupled to the third terminal, and
   the second electrode of the third light-emitting element is coupled to the fourth terminal.

8. The light source device according to claim 1, further comprising:
   a sixth light-emitting element that is disposed in the second path, includes a first electrode of the first type coupled to the second electrode of the second light-emitting element and a second electrode of the second type, and emits the second basic color light; and a seventh light-emitting element that is disposed in the third path, includes a first electrode of the first type coupled to the second electrode of the third light-emitting element and a second electrode of the second type, and emits the third basic color light.

9. The light source device according to claim 1, wherein
each of the first electrode of the first light-emitting element, the first electrode of the second light-emitting element, the first electrode of the third light-emitting element serves as an anode electrode, and
each of the second electrode of the first light-emitting element, the second electrode of the second light-emitting element, and the second electrode of the third light-emitting element serves as a cathode electrode.

10. The light source device according to claim 1, wherein
each of the first electrode of the first light-emitting element, the first electrode of the second light-emitting element, the first electrode of the third light-emitting element serves as a cathode electrode, and
each of the second electrode of the first light-emitting element, the second electrode of the second light-emitting element, and the second electrode of the third light-emitting element serves as an anode electrode.

11. A light-emitting device comprising:
a first light-emitting element that is disposed in a first path from a first terminal to a second terminal, includes a first electrode of a first type and a second electrode of a second type coupled to the second terminal, and emits first basic color light;
a second light-emitting element that is disposed in a second path from the second terminal to a third terminal, includes a first electrode of the first type coupled to the second terminal and a second electrode of the second type, and emits second basic color light;
a third light-emitting element that is disposed in a third path from the second terminal to a fourth terminal, includes a first electrode of the first type coupled to the second terminal and a second electrode of the second type, and emits third basic color light;
a first switch that is turned to an ON state to couple the first terminal and the second terminal to each other;
a second switch that is turned to the ON state to couple the second terminal and the third terminal to each other;
a third switch that is turned to the ON state to couple the second terminal and the fourth terminal to each other;
a first current source coupled to the third terminal;
a second current source coupled to the fourth terminal; and
a light emission controller that controls operations of the first switch, the second switch, and the third switch.

12. The light-emitting device according to claim 11, wherein the light emission controller controls each of lengths of a period in which the first switch is in the ON state, a period in which the second switch is in the ON state, and a period in which the third switch is in the ON state.

13. The light-emitting device according to claim 11, further comprising:

a fourth switch that is turned to the ON state to couple the third terminal and the first current source to each other; and
a fifth switch that is turned to the ON state to couple the fourth terminal and the second current source to each other, wherein
the light emission controller also controls operations of the fourth switch and the fifth switch.

14. The light-emitting device according to claim 13, wherein
the light emission controller turns the fourth switch to an OFF state in a case where both the first switch and the second switch are in the ON state, and
the light emission controller turns the fifth switch to the OFF state in a case where both the first switch and the third switch are in the ON state.

15. A display device comprising:
a plurality of light-emitting devices, each of the light-emitting devices including:
a first light-emitting element that is disposed in a first path from a first terminal to a second terminal, includes a first electrode of a first type and a second electrode of a second type coupled to the second terminal, and emits first basic color light,
a second light-emitting element that is disposed in a second path from the second terminal to a third terminal, includes a first electrode of the first type coupled to the second terminal and a second electrode of the second type, and emits second basic color light,
a third light-emitting element that is disposed in a third path from the second terminal to a fourth terminal, includes a first electrode of the first type coupled to the second terminal and a second electrode of the second type, and emits third basic color light,
a first switch that is turned to an ON state to couple the first terminal and the second terminal to each other,
a second switch that is turned to the ON state to couple the second terminal and the third terminal to each other,
a third switch that is turned to the ON state to couple the second terminal and the fourth terminal to each other,
a first current source coupled to the third terminal,
a second current source coupled to the fourth terminal, and
a light emission controller that controls operations of the first switch, the second switch, and the third switch.

16. The display device according to claim 15, further comprising a driver that supplies a first pixel signal, a second pixel signal, and a third pixel signal to each of the light-emitting devices, wherein
the light emission controller controls a length of a period in which the first switch is in the ON state on a basis of the first pixel signal,
the light emission controller controls a length of a period in which the second switch is in the ON state on a basis of the second pixel signal, and
the light emission controller controls a length of a period in which the third switch is in the ON state on a basis of the third pixel signal.

* * * * *